United States Patent
Lewis, II et al.

(10) Patent No.: US 7,438,638 B2
(45) Date of Patent: Oct. 21, 2008

(54) RATIO OF OPEN AREA TO CLOSED AREA IN PANELS FOR ELECTRONIC EQUIPMENT ENCLOSURES

(75) Inventors: Richard Evans Lewis, II, Austin, TX (US); Ian Seaton, Round Rock, TX (US); James I. Lawrence, Georgetown, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 0 days.

(21) Appl. No.: 11/548,158

(22) Filed: Oct. 10, 2006

(65) Prior Publication Data

US 2007/0183129 A1 Aug. 9, 2007

Related U.S. Application Data

(60) Provisional application No. 60/725,511, filed on Oct. 10, 2005.

(51) Int. Cl.
*H05K 7/20* (2006.01)
*H05K 5/00* (2006.01)

(52) U.S. Cl. ............... 454/184; 361/687; 361/692; 361/724

(58) Field of Classification Search ............ 454/184; 361/724, 687, 692
See application file for complete search history.

(56) References Cited

U.S. PATENT DOCUMENTS

| | | | |
|---|---|---|---|
| D340,700 S * | 10/1993 | Shukur et al. ............. D13/184 |
| 5,460,441 A * | 10/1995 | Hastings et al. ............. 312/298 |
| 5,671,805 A * | 9/1997 | Stahl et al. ................. 165/80.3 |
| 5,997,117 A * | 12/1999 | Krietzman ............... 312/265.4 |
| 6,034,873 A * | 3/2000 | Stahl et al. ................... 361/701 |
| 6,185,098 B1 * | 2/2001 | Benavides ................... 361/695 |
| 6,454,646 B1 * | 9/2002 | Helgenberg et al. ......... 454/184 |
| 6,548,753 B1 * | 4/2003 | Blackmon et al. ............. 174/50 |
| 6,557,357 B2 * | 5/2003 | Spinazzola et al. ............ 62/89 |
| 6,672,955 B2 * | 1/2004 | Charron ...................... 454/184 |
| 2005/0135075 A1 * | 6/2005 | Deng ........................ 361/797 |

* cited by examiner

*Primary Examiner*—Steven B. McAllister
*Assistant Examiner*—Patrick F. O'Reilly, III
(74) *Attorney, Agent, or Firm*—Tillman Wright, PLLC; James D. Wright; Chad D. Tillman

(57) ABSTRACT

A method of providing an electronic equipment enclosure having a plurality of panels, including identifying at least one panel through which air is intended to flow, determining the design parameters of the identified panel, and providing an electronic equipment enclosure that includes the identified panel, constructed according to the determined design parameters. Determining the design parameters of the identified panel includes first establishing a maximum ratio of open area to closed area of between 60% and 70% and then determining one or more other parameters of the design of the identified panel in view of the established maximum ratio of open area to closed area. Other parameters include the material of which the identified panel is to be constructed, its thickness, and its rigidity. Specific enclosures benefiting from the design process are also described.

25 Claims, 36 Drawing Sheets

| Lower (Units 10-12) | Fan | Intake Surface T (°F) | Exhaust Fan T (°F) | ΔT (°F) | Exhaust Flowrate (CFM) |
|---|---|---|---|---|---|
| | 1 | 55 | 70.2 | 15.2 | 54.18 |
| | 2 | 56 | 73.3 | 17.3 | 58.21 |
| | 3 | | 74.2 | | 56.70 |
| | 4 | 60 | 71.6 | 11.6 | 58.21 |

| Middle (Units 30-32) | Fan | Intake Surface T (°F) | Exhaust Fan T (°F) | ΔT (°F) | Exhaust Flowrate (CFM) |
|---|---|---|---|---|---|
| | 1 | 57 | 70.4 | 13.4 | 55.69 |
| | 2 | 56 | 72.8 | 16.8 | 53.17 |
| | 3 | | 79.1 | | 52.92 |
| | 4 | 63 | 83.9 | 20.9 | 54.18 |

| Upper (Units 43-45) | Fan | Intake Surface T (°F) | Exhaust Fan T (°F) | ΔT (°F) | Exhaust Flowrate (CFM) |
|---|---|---|---|---|---|
| | 1 | 73 | 89.5 | 16.5 | 53.93 |
| | 2 | 70 | 91.4 | 21.4 | 55.19 |
| | 3 | | 90.3 | | 55.44 |
| | 4 | 72 | 88.6 | 16.6 | 55.69 |

FIG. 3

|  | Fan | Intake Surface T (°F) | Exhaust Fan T (°F) | ΔT (°F) | Exhaust Flowrate (CFM) |
|---|---|---|---|---|---|
| Lower (Units 10-12) | 1 | 60 | 71 | 11 | 55.69 |
|  | 2 | 59 | 74 | 15 | 56.95 |
|  | 3 | 61 | 74.1 | 13.1 | 55.69 |
|  | 4 | 63 | 72.6 | 9.6 | 55.69 |

|  | Fan | Intake Surface T (°F) | Exhaust Fan T (°F) | ΔT (°F) | Exhaust Flowrate (CFM) |
|---|---|---|---|---|---|
| Middle (Units 30-32) | 1 | 59 | 69.3 | 10.3 | 54.18 |
|  | 2 | 57 | 71.3 | 14.3 | 54.94 |
|  | 3 |  | 76.3 |  | 50.90 |
|  | 4 | 68 | 80.1 | 12.1 | 54.68 |

|  | Fan | Intake Surface T (°F) | Exhaust Fan T (°F) | ΔT (°F) | Exhaust Flowrate (CFM) |
|---|---|---|---|---|---|
| Upper (Units 43-45) | 1 | 78 | 87.3 | 9.3 | 53.42 |
|  | 2 | 74 | 89.1 | 15.1 | 53.42 |
|  | 3 |  | 89.9 |  | 53.93 |
|  | 4 | 75 | 87.3 |  | 55.69 |

FIG. 4

|  | | Airflow (CFM) | | |
|---|---|---|---|---|
|  | Fan | 100% | 63% | % flow reduction |
| lower | 1 | 54.2 | 55.7 | 1.03 |
|  | 2 | 58.2 | 57.0 | 0.98 |
|  | 3 | 56.7 | 55.7 | 0.98 |
|  | 4 | 58.2 | 55.7 | 0.96 |
|  | total for chassis | 227.3 | 224.0 | 0.99 |
| middle | 1 | 55.7 | 54.2 | 0.97 |
|  | 2 | 53.2 | 54.9 | 1.03 |
|  | 3 | 52.9 | 50.9 | 0.96 |
|  | 4 | 54.2 | 54.7 | 1.01 |
|  | total for chassis | 216.0 | 214.7 | 0.99 |
| upper | 1 | 53.9 | 53.4 | 0.99 |
|  | 2 | 55.2 | 53.4 | 0.97 |
|  | 3 | 55.4 | 53.9 | 0.97 |
|  | 4 | 55.7 | 55.7 | 1.00 |
|  | total for chassis | 220.3 | 216.5 | 0.98 |

FIG. 5

|  | 12 fans ||| | 10 fans ||| | 8 fans ||| | 6 fans |||
| --- | --- | --- | --- | --- | --- | --- | --- | --- | --- | --- | --- | --- |
|  | Measured Flow (Ft/sec) | Est. Flow (CFM/ RMU) | Sim. Flow (CFM/ 45 RMU) | Measured Flow (Ft/sec) | Est. Flow (CFM/ RMU) | Sim. Flow (CFM/ 45 RMU) | Measured Flow (Ft/sec) | Est. Flow (CFM/ RMU) | Sim. Flow (CFM/ 45 RMU) | Measured Flow (Ft/sec) | Est. Flow (CFM/ RMU) | Sim. Flow (CFM/ 45 RMU) |
| Open | 37.5 | 37.5 | 79.5 | 3580 | 37.3 | 37.3 | 65.9 | 2967 | 38.4 | 38.2 | 54.2 | 2437 | 37.7 | 37.4 | 39.8 | 1792 |
| 8% | 16.4 | 16.2 | 34.6 | 1556 | 18.4 | 18.0 | 32.2 | 1448 | 23.2 | 23.0 | 32.7 | 1470 | 25.0 | 25.0 | 26.5 | 1193 |
| % flow reduction | 56.3 | 56.8 | 56.5 | 56.5 | 50.7 | 51.7 | 51.2 | 51.2 | 39.6 | 39.8 | 39.7 | 39.7 | 33.7 | 33.2 | 33.4 | 33.4 |
| Open | 37.5 | 37.8 | 79.9 | 3594 | 37.2 | 37.0 | 65.6 | 2951 | 37.8 | 37.8 | 53.5 | 2406 | 37.3 | 37.0 | 39.4 | 1773 |
| 40% | 34.6 | 34.8 | 73.6 | 3312 | 34.8 | 35 | 61.7 | 2776 | 36.7 | 36.7 | 51.9 | 2336 | 36.5 | 36.4 | 38.7 | 1740 |
| % flow reduction | 7.7 | 7.9 | 7.8 | 7.8 | 6.5 | 5.4 | 5.9 | 5.9 | 2.9 | 2.9 | 2.9 | 2.9 | 2.1 | 1.6 | 1.9 | 1.9 |
| Open | 37.5 | 37.5 | 79.5 | 3580 | 36.8 | 36.8 | 65.1 | 2927 | 37.7 | 37.7 | 53.3 | 2399 | 37.0 | 37.0 | 39.2 | 1766 |
| 63% | 37.0 | 36.8 | 78.3 | 3522 | 36.2 | 36.2 | 64 | 2880 | 37.4 | 37.3 | 52.8 | 2377 | 36.8 | 36.8 | 39.0 | 1756 |
| % flow reduction | 1.3 | 1.9 | 1.6 | 1.6 | 1.6 | 1.6 | 1.6 | 1.6 | 0.8 | 1.1 | 0.9 | 0.9 | 0.5 | 0.5 | 0.5 | 0.5 |

*FIG. 8*

| Door Configuration | % flow reduction | theoretical flowrate (CFM) | theoretical delta T (°C) | theoretical increase in processor T due to door airflow restriction (°C) |
|---|---|---|---|---|
| 100% | 0 | 3120 | 14.24 | N/A |
| 63% | 1.6 | 3070 | 14.47 | 0.23 |
| 40% | 7.8 | 2831 | 15.69 | 1.46 |
| 8% | 56.5 | 1231 | 36.08 | 21.84 |

FIG. 11

RATIO OF OPEN AREA TO CLOSED AREA IN PANELS FOR ELECTRONIC EQUIPMENT ENCLOSURES

CROSS-REFERENCE TO RELATED APPLICATION

The present application is a U.S. nonprovisional patent application of, and claims priority under 35 U.S.C. §119(e) to, U.S. provisional patent application Ser. No. 60/725,511, filed Oct. 10, 2005, which provisional patent application is incorporated by reference herein.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

1. Field of the Present Invention

The present invention generally relates to methods and apparatus for thermal management in electronic equipment enclosures, and, in particular, to the effects of perforations in various walls and other panels of enclosures on temperature, air flow and other thermal phenomena.

2. Background

Racks, frames and enclosures for mounting and storing computer and other electronic components or equipment (hereinafter referred to as "electronic equipment") have been well known for many years. Racks and frames are typically simple rectangular frameworks on which electronic equipment may be mounted, or on which other mounting members, such as shelves or brackets, may be mounted which in turn may support the electronic equipment. Enclosures are typically frames on which panels or doors, or both, are hung to provide aesthetic improvement, to protect the equipment from external influences, to provide security for the equipment stored inside, or for other reasons.

Racks, frames and enclosures have been built in many different sizes and with many different proportions in order to best accommodate the equipment which they are designed to store. Electronic equipment stored in these enclosures may include audio and video equipment and the like, but quite frequently include computer equipment and related peripheral devices. These components typically include housings enclosing internal operative elements.

The electronic equipment housed in the enclosures generate large amounts of thermal energy. The enclosures frequently make use of fans and perforated panels, among other things, to help control the thermal energy and maximize the flow of cooling air through the enclosure and exhausting heated air therefrom. Such panels are perhaps most frequently used on doors, but may also be used in top, bottom, side, front and back walls and in interior surfaces as well, such as shelves or partitions.

The supply of cool air to the enclosure, and the transfer of thermal energy from the electronic equipment, is conventionally handled by a Computer Room Air Conditioner ("CRAC"). Airflow into the enclosure generally relies solely or at least primarily on the air pressure differential as measured between the entry point of air into the room and the ambient room. However, active means are often used to push or pull heated air out of the enclosures.

For a particular component, thermal energy is transferred from its housing using forced air convection. More specifically, internal fans draw or push air through the housing from front-to-rear over the heated internal elements within the housing. The air absorbs the thermal energy from the internal elements and carries it away as it exits the housing.

Airflow through a particular component housing is primarily controlled by the internal fan installed by the manufacturer. While it is possible to reduce this throughput by constricting air flow through an enclosure, it is difficult to appreciably increase the airflow through a component housing.

One way in which enclosure manufacturers have tried to increase airflow to an enclosure is to increase the number of perforations in an enclosure panel. For a panel, the ratio of the openings created by perforations therein to the total area of the panel can be expressed as the "percent open area" (or "percent open") of the panel. Equipment manufacturers have sometimes specified a minimum percent open for third party enclosures being used to house their equipment. Typically, equipment manufacturers have specified a minimum percent open of 63%. Enclosures are presently available that provide panels with percent open values ranging up to 80% open. If no panel whatsoever is used, the resulting opening may be described as 100% open.

Despite the presence of perforated panels and fans, the ability to run an efficient data center can be a challenge especially when dealing with legacy installations while trying to plan for future applications. The principles of data center design for effective thermal management with high density data communications equipment heat loads are frequently violated. More often than not these violations come via an acquisition of previously developed space or habitation of mature space designed for equipment with lower heat loads.

There are a number of standard practices and a few creative patches that are used in an attempt to minimize or neutralize the resultant hot spots caused by these violations. These patches include adding high static pressure blowers to the bottom spaces of equipment enclosures; plugging all sources of bypass air; creating barriers to hot air recirculation, such as internal enclosure air dams, enclosure top return air isolation panels, and closed duct return air paths; and adding floor fans to deliver more cold air to the fronts of enclosures.

Another approach that has commonly been used is the removal of one or more panels, such as a front door or another easily-removed panel, from the enclosure itself, thus resulting in a "100% open" opening. This has been traditionally thought to maximize the amount of air-flow through the opening, even when the panel thus removed already had at least some perforations therethrough, and in particular, even when the percent open area created by the perforations was already as great as the minimum specified by equipment manufacturers. It has further traditionally been thought that maximizing airflow through the enclosure maximized removal of thermal energy from the enclosure. Unfortunately, the removal of such a panel is not an ideal solution, since it results in a security risk, is inconvenient for the user, and causes other problems.

In addition, it has traditionally been thought that providing a maximum percent open in a perforated panel maximizes the amount of airflow through and thus thermal energy removed from the enclosure. However, as percent open increases, the thickness of the panel is typically reduced. As the thickness of the perforated panel decreases, so to does the security and stability of the enclosure. Therefore, increasing the percent open of a perforated panel is also not always an ideal solution. This issue becomes particularly critical as the percent open is increased beyond about 63%.

Thus, a need exists for a perforation solution that maximizes the relative benefit achieved by airflow through the enclosure while still maintaining the various advantages provided by relatively thick panels rather than thin panels or uncovered openings. More particularly, the effectiveness of removing panels from an equipment enclosure or using a relatively thin perforated panel with a percent open greater than 63% relative to the benefits provided by relatively thicker perforated panels with a percent open of 63% or less has not previously been understood in the enclosure industry. As a result, the design process for panels for electronic equipment enclosures has been inexact, and designers have been forced to vary multiple design parameters for a particular panel during their design process in an effort to develop a design that satisfies the various criteria for the panel.

SUMMARY OF THE PRESENT INVENTION

The present invention includes many aspects and features. Moreover, while many aspects and features relate to, and are described in, the context of methods and apparatus for thermal management in electronic equipment enclosures, the present invention is not limited to use only in thermal management in electronic equipment enclosures, as will become apparent from the following summaries and detailed descriptions of aspects, features, and one or more embodiments of the present invention.

Accordingly, one aspect of the present invention relates to a method of providing an electronic equipment enclosure having a plurality of panels, the method including: identifying at least one panel of the plurality of panels through which air is intended to flow; determining the design parameters of the at least one panel, including: for the identified panel, first establishing a maximum ratio of open area to closed area of between 60% and 70%, and determining one or more other parameters of the design of the identified panel in view of the established maximum ratio of open area to closed area; and providing an electronic equipment enclosure that includes the identified panel, constructed according to the determined design parameters.

In a feature of this aspect, the step of establishing a maximum ratio of open area to closed area includes establishing a maximum ratio of open area to closed area of about 63%. In another feature of this aspect, determining the design parameters includes maintaining the first-established maximum ratio while the one or more other parameters are determined, and wherein providing the enclosure includes providing an electronic equipment enclosure that includes the identified panel, constructed according to the determined design parameters, including the first-established maximum ratio.

In additional features, determining one or more other parameters of the design of the identified panel includes determining, in view of the established maximum ratio of open area to closed area, a material of which the identified panel is to be constructed, the thickness of the material, and the rigidity of the identified panel. In a further feature of this aspect, determining one or more other parameters of the identified panel includes determining at least two other parameters, and iteratively varying the at least two other parameters while maintaining the established maximum ratio of open area to closed area of between 60% and 70%.

Another aspect of the present invention relates to a method of providing an electronic equipment enclosure having a front panel and a rear panel, the method including: identifying one panel, of the front panel and the rear panel, through which air is intended to flow, wherein the identified panel defines a first panel, and wherein the other panel, of the front panel and the rear panel, defines a second panel; determining the design parameters of the first panel, including establishing a maximum ratio of open area to closed area of between 60% and 70%; determining the design parameter of the second panel, including establishing a ratio of open area to closed area of about 0%; and providing an electronic equipment enclosure, including: providing the first panel constructed according to its determined design parameters, providing the second panel constructed according to its determined design parameters, and providing an exhaust duct extending upward from a top of the enclosure.

In a feature of this aspect, the step of establishing a maximum ratio of open area to closed area includes establishing a maximum ratio of open area to closed area of about 63%, and while in another feature of this aspect, determining the design parameters of the first panel includes determining one or more other parameters of the design of the first panel in view of the established maximum ratio of open area to closed area for the first panel.

In other features of this aspect, the step of providing an exhaust duct includes providing an exhaust duct that extends from the top of the enclosure to a ceiling structure of a room in which the electronic equipment enclosure is disposed; the step of providing an exhaust duct includes connecting the exhaust duct to the ceiling structure such that the exhaust duct is in direct fluid communication with a ceiling-mounted return air duct of the room in which the electronic equipment enclosure is disposed; and the step of providing an exhaust duct includes providing an exhaust duct having a rectangular cross-section.

In still other features of this aspect, determining the design parameters of the first panel includes maintaining the established maximum ratio while the one or more other parameters are determined, and wherein providing the enclosure includes providing the first panel constructed according to its determined design parameters, including the established maximum ratio; and determining one or more other parameters of the design of the first panel includes: determining at least two other parameters of the design of the first panel, and iteratively varying the at least two other parameters while maintaining the established maximum ratio of open area to closed area of about 63%.

Yet another aspect of the present invention relates to a method of providing an electronic equipment enclosure having a plurality of panels, the method including: identifying a first panel and a second panel, of the plurality of panels, through which air is intended to flow; determining the design parameters of the first panel, including establishing a maximum ratio of open area to closed area of between 60% and 70%; determining the design parameters of the second panel, including establishing a maximum ratio of open area to closed area of between 60% and 70%; and providing an electronic equipment enclosure, including: providing the first and second panels constructed according to their determined design parameters, and providing an above cabinet barrier extending upward from a top of the enclosure.

In a feature of this aspect, the step of determining the design parameters of the first panel includes establishing a maximum ratio of open area to closed area of about 63%.

In additional features of this aspect, determining the design parameters of the first panel includes determining one or more other parameters of the design of the first panel in view of the established maximum ratio of open area to closed area for the first panel; determining the design parameters of the first panel includes maintaining the established maximum ratio while the one or more other parameters are determined, and wherein providing the enclosure includes providing the first panel constructed according to its determined design parameters, including the established maximum ratio; and determining one or more other parameters of the design of the first panel includes: determining at least two other parameters of the design of the first panel, and iteratively varying the at least two other parameters while maintaining the established maximum ratio of open area to closed area of about 63%

In still other features of this aspect, determining the design parameters of the second panel includes establishing a maximum ratio of open area to closed area of about 63%; the electronic equipment enclosure has a front and a rear, and wherein the first and second panels are the front and rear panels of the electronic equipment enclosure; and the above cabinet barrier extends substantially entirely from one side of the electronic equipment enclosure to the opposite side.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein:

FIG. 3 is a tabular illustration depicting measured data for a test enclosure similar to the enclosure of FIG. 1 but with the door removed;

FIG. 4 is a tabular illustration depicting measured data for the test enclosure wherein a front panel door with 63 % open area was attached thereto;

FIG. 5 is a table showing the flow reduction for the 63 % open door panel of FIG. 4 calculated as a percentage of the flow reduction for the 100 % open configuration of FIG. 6 is a graphical illustration depicting CPU temperature as a function of blade slot;

FIG. 8 is a tabular illustration depicting raw flow rate data and calculated data indicating simulated flowrate and percent flowrate reduction;

FIG. 11 is a tabular illustration depicting calculated theoretical flowrate and cooling information based on measured flowrate data from a controlled flowrate test;

DETAILED DESCRIPTION OF THE PREFERRED EMBODIMENTS

Figure 1:
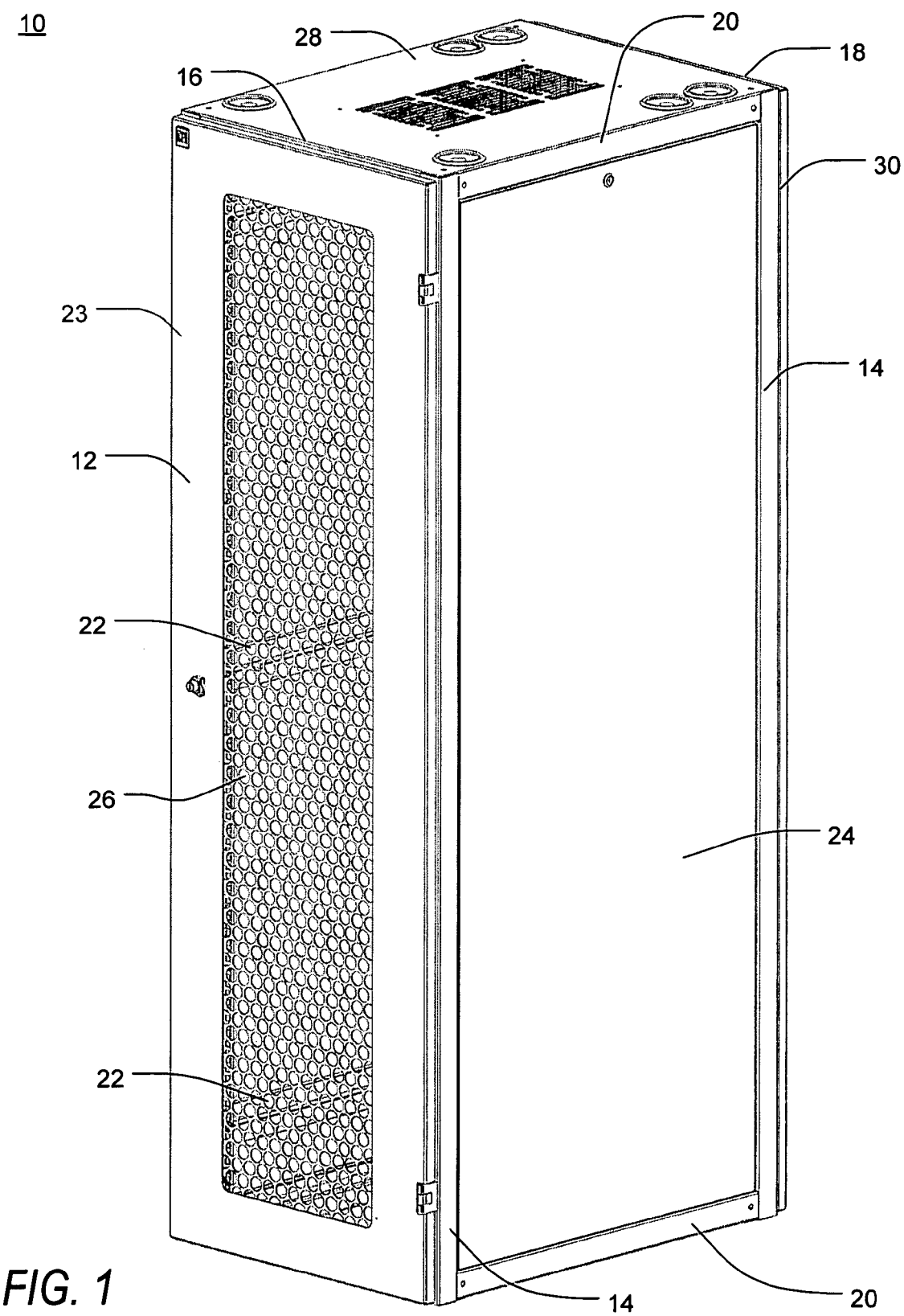
FIG. 1 is an orthogonal view of a representative enclosure including a perforated front panel door in accordance with a preferred embodiment of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

FIG. 1 is an orthogonal view of a representative enclosure 10 including a perforated front panel door 12 in accordance with a preferred embodiment of the present invention. The equipment enclosure 10 includes a four post frame structure having panels, more fully described hereinbelow, enclosing the enclosure, attached thereto. The four post frame structure may be of conventional design and construction. As shown and described, the four post frame structure includes four vertical support posts 14, upper and lower front cross members 16, upper and lower rear cross members 18 and two pairs of upper and lower side cross members 20. Each vertical support post 14 includes a plurality of cross member attachment apertures at each end. Two of the vertical support posts 14 are connected together at their upper and lower ends by the upper and lower front cross members 16, respectively, and the other two support posts 14 are connected together at their upper and lower ends by the upper and lower rear cross members 18, respectively. The front cross members 16 and their respective support posts 14 thus define a front frame, and the rear cross members 18 and their respective support posts 14 define a rear frame. The front and rear frames may then be connected together at their respective corners by the upper and lower side cross members 20.

Any known connection means may be used to join the various members together. Although not illustrated herein, at least one other example of conventional connection means is described in commonly-assigned U.S. Pat. No. 6,185,098, the entirety of which is incorporated herein by reference. Although likewise not illustrated herein, the precision and the stability of each of the corners of at least some types of four post frame structures may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

It will be evident to the Ordinary Artisan that other structures may be used to form a frame structure on which panels may be mounted to form an enclosure. For example, in at least one embodiment (not illustrated), a frame structure may be formed from only two support posts.

The four post frame structure may further comprise one or more pairs of horizontal mounting rails 22. Each horizontal mounting rail 22 may include a slot running substantially its entire length. In addition, one or more pairs of vertical mounting rails are mounted to the horizontal mounting rails using suitable fasteners held in place in the slots of the horizontal mounting rails 22. Each vertical mounting rail preferably includes a series of threaded mounting apertures, arranged in evenly-spaced sets, extending along substantially its entire length for use in mounting electronic components, peripheral devices, cable brackets, additional mounting members, or the like thereto. It is contemplated that the number of horizontal and vertical mounting rails is variable. For example, an enclosure may include two horizontal mounting rails and two vertical mounting rails, three horizontal mounting rails and three vertical mounting rails, or the like. Further, although the number of horizontal mounting rails is equal to the number of vertical mounting rails in the two examples mentioned herein, it is not necessary that the number of mounting rails be equal. It is further contemplated that, alternatively, each horizontal mounting rail may include one or more rows of mounting apertures extending along its length.

In addition to the front panel 23 the illustrated enclosure 10 includes a right panel 24, a left panel 26, a top panel 28 and a back panel 30, all attached to the frame structure, which together form the walls of the enclosure. The right and left panels 24,26 are similarly dimensioned and constructed. As noted previously, the front panel 23 is perforated or ventilated. The Ordinary Artisan will understand that either variation of a front panel (i.e., perforated or ventilated) is operative to provide a path for air to enter the enclosure 10 for cooling the components contained therein. It is preferred that the front panel 23 be perforated or ventilated with a percent open of between 60 % and 70% and more preferably about 63%as further described herein below. The back panel 30 may be a lockable door, a pair of doors, a panel, or the like. Also, it will be evident to the Ordinary Artisan that alternatively other types of doors and panels may be substituted for the various panels, and that one or more of the illustrated panels (such as one or both side panels) may in some cases be omitted altogether (such as in a row of two or more adjoining enclosures). In at least some embodiments, it is preferred that the back panel be solid, i.e., substantially air impervious, while in others the back panel 30 may be perforated or ventilated like, or instead of, the front panel 23. Any known connection means may be used to join the panels to the frame structure.

As mentioned previously, the front panel of the enclosure 10 includes perforations providing a percent open of about around 63%. Front panels are commonly available that have a percent open ranging from a relatively low percent open, e.g., 40%, to a relatively high percent open, e.g., 80%. It is also possible to remove the front panel altogether, which would provide a percent open of 100%.

In the enclosure industry, the cooling effect of varying the percent open of a panel was not previously understood. That is, it was commonly assumed that an increase in the percent open of a front panel (or any other panel) would necessarily correlate to an increase in removal of thermal energy from the enclosure to which the front panel was attached, or removed, in certain situations. Therefore, the thought was that an enclosure having a perforated front panel with a relatively high percent open, such as 80% or more, or having no front panel at all would provide for greater removal of thermal energy than an enclosure having a front panel (or any other panel) with a relatively lower percent open. Unfortunately, increasing the panel percent open beyond around about 63% requires the use of a relatively thin material for the panel. In order for the perforations to be close enough to one another to increase the percent open to greater than around about 63%, the panel material must be thinner. Accordingly, a perforated panel with 80% open is thinner than a perforated panel with 63% open. Using the thinner material reduces the security and strength of the enclosure. Therefore, there is a potential trade off between a panel's percent open and the security of the enclosure to which the panel is attached.

As counterintuitive as it may be, using experimental tests described below, it has been determined that increasing the percent open area of an enclosure panel, such as the front door of an enclosure, over a certain threshold percent open area does not appreciably increase the cooling airflow through the panel. The threshold percent open area was determined to be around about 63%. This finding may be applied to any of a wide variety of enclosures, including those in the commonly-assigned U.S. Pat. Nos. 5,997,117 and 6,185,098 and the commonly assigned U.S. Pat. No. Des. 340,700, the entirety of each of which is incorporated herein by reference.

In the first of the experimental tests, an airflow and cooling audit was performed to determine whether corrective actions taken in a data center delivered the anticipated cooling benefit. More particularly, airflow through an enclosure with various percent open door configurations was monitored. To aid in understanding the experimental test, a general overview of the heat transfer principles and server cooling principles are provided herein.

First, there are various equations which may be used to describe the cooling that happens with server equipment in enclosures. One equation is the equation for forced air convective heat transfer. More particularly, convective heat transfer from a surface to an airflow is governed by the following equation:

$$Q = hA(T_W - T_f)$$

Where: Q=the heat transfer rate (BTU-hr)
h=the convection heat transfer coefficient (BTU/(h*ft$^2$*° F.))
A=the surface area (ft$^2$)
Tw=the temperature of the surface (° F.)
Tf=the temperature of the fluid (° F.)

The amount of cooling taking place inside of a particular piece of equipment, such as a server, may also be measured using the equation for sensible cooling. Sensible cooling is the removal of thermal energy that auses a change in temperature without a change in humidity. The equation for sensible cooling is as follows:

$$\text{Cooling} = \Delta T * \text{airflow} * 1.08$$

Where: Cooling =amount of cooling (BTU-hr)

ΔT =the difference in air temperature between source and return air (° F)
airflow =airflow rate (cubic feet per minute –CFM)

The sensible cooling equation can be rearranged and converted into metric units to create the following equation, which may be used to describe airflow in a typical datacenter environment.

$$\text{airflow} = \frac{1.67\,W}{C_t}$$

Where: airflow=airflow through server (CFM)
W=power (Watts)
Ct=Temperature rise across the equipment (° C.)

It is instructive to review what these equations are describing. When the heat transfer equation is applied to equipment enclosures, every factor except the fluid temperature (Tf) is essentially a constant defined by the equipment manufacturer. Therefore, the only variable which may be effectively varied is the temperature of the input air.

Similarly, in the sensible cooling equation, every factor is controlled by the equipment performance specification. More specifically, the airflow is controlled by the fans in the servers. The airflow may vary if the fans are variable speed fans or if the fans are choked by inadequate air supply, but the airflow is primarily dictated by the equipment manufacturer and its choice of fans. Temperature difference between source air and return air is a function of the equipment and the air crossing it. As with the heat transfer equation, temperature rise in the airflow equation is a constant defined internal to the server. While sensible cooling is variable at the room level and may be affected by various factors, there is nothing variable about sensible cooling at the equipment level. Based on the foregoing, it should be apparent that the only variable over which a user has any control, as far as equipment heat transfer is concerned, is the temperature of the air that is being drawn into the equipment housing.

As mentioned previously, an audit was performed in a data center having thermal management issues. As a part of this audit, experimental flowrate tests were performed on an enclosure having a perforated front door panel with 63% open area and on the same enclosure with the front door panel having been removed, i.e., 100% open area. Both tests were performed at a flow rate of approximately 2800 cubic feet per minute. The results from the acquired data suggest that increasing the percent open area of the door perforation above 63% does not significantly affect the net airflow rate through the server. Such a result was completely unexpected.

Because the results of the data center audit were so unexpected, a subsequent experimental test was performed in a more controlled setting to verify the anticipated poorer airflow performance in panels with percent open areas less than 63% and to validate the results from the data center test regarding airflow in panels with greater than 63% open area.

As previously described, server temperatures are affected by input air temperature and by server fan choking. If the server fans are not choked, input air temperature is left as the affecting factor for server temperature. As such, it is important to understand the effects of choking the server fans with front panel doors that are not 100% open. Therefore, in the subsequent test, the only variable considered was restriction to airflow, i.e., choking, caused by the front door panel not being 100% open.

The data from the second experimental test confirmed the findings from the less-controlled data center test and specifically indicated that only a minimal flow efficiency improvement can be expected when changing from a panel having 63% open area to no panel whatsoever, i.e., 100% open area. That is, increasing the percent open area above 63% does not significantly affect either (a) the airflow rate through the equipment or (b) the temperatures of the CPUs in the equipment.

This result runs completely counter to a widely held belief and to intuition regarding perforated metal enclosure doors. Based on the findings of the two experimental tests that were performed, perforated metal enclosure doors that have 63% open do not appear to be appreciably more restrictive to the flow of air through them than does an enclosure with its front completely open. Presently, it is common practice for technical personnel in data centers to remove perforated metal enclosure doors because it seems intuitive that removing the doors, thereby creating a state of 100% open area, would substantially improve the airflow through the rack-mounted equipment in the enclosures and thus lower the temperatures of the CPUs in the equipment. However, the experimental tests that were performed show that removing the doors does not, in fact, appreciably increase flow rate or thermal energy removal from an enclosure. Consequently, the results of these tests are important for designers, manufacturers, and users of enclosures with perforated metal doors used in contemporary data centers.

Figure 2:
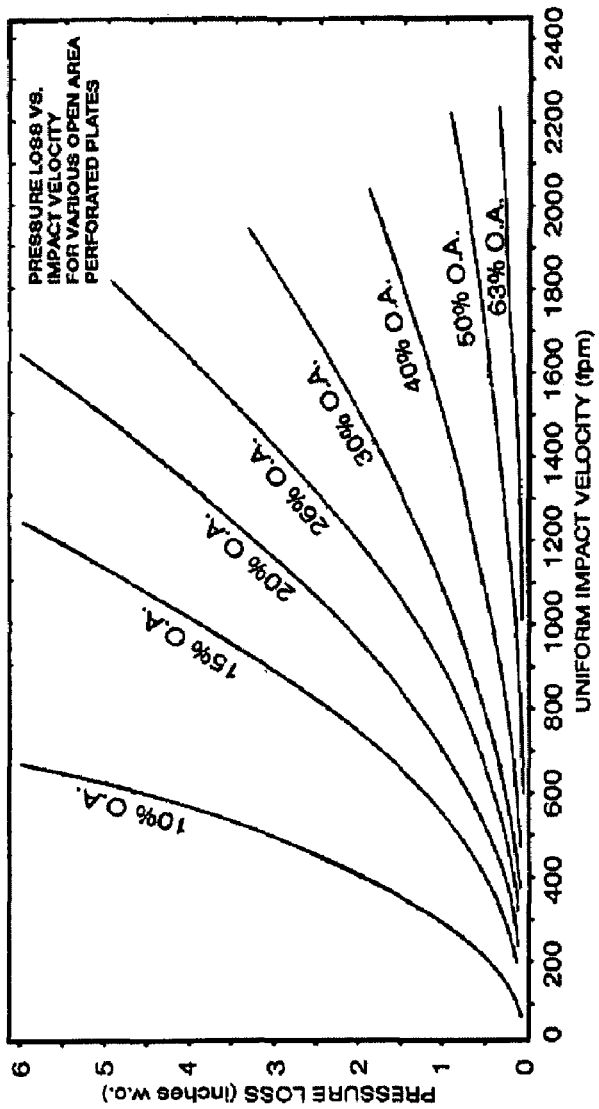
FIG. 2 is a graphical illustration depicting prior art knowledge of pressure loss as a function of uniform impact velocity.

The Industrial Perforators Association has provided a chart, shown in FIG. 2, showing pressure loss in inches of water column as a function of uniform impact velocity in feet per minute. Although this chart provides pressure loss and flow rate information, it does not provide information that is readily usable and understandable to equipment enclosure designers and manufacturers. More specifically, it does not indicate whether increased percent open area provides increased flow rate, and more importantly, increased thermal energy removal.

The second experimental test mentioned above and described below was specifically designed to provide direct, precise, and easy-to-understand information for enclosure designers, manufacturers and users. In the test, the percent open area of a perforated metal door was varied and the effect on airflow rate through the door was measured.

During this test, the airflow rate was varied as is shown in FIG. 8, which is explained in more detail below. The range of flowrates was selected because the rate of airflow through perforated metal enclosure doors, expressed as Uniform Impact Velocity in feet- per-minute (fpm), is not found to be greater than approximately 1,000 fpm in contemporary data centers with high power densities.

An examination of the experimental data obtained provides confirmation that, over the expected range of airflow rates and using fans of the type commonly found in the rack-mounted equipment in data centers, the rate of cooling airflow through the door can only be increased by a maximum of approximately 1.6% by increasing the percent open of the perforated metal door panel above 63%. The test thus provides direct, precise, and easy-to-understand information to enclosure designers, which was previously unavailable.

As mentioned above, it is also important to understand whether increasing the percent open area in a front panel provides increased thermal energy removal for equipment in an enclosure. The second experimental test performed provided data that was used to calculate a theoretical operating temperature decrease for the various door configurations and flow rates that were used in the test. The results of the calculations indicate that the decrease in server operating temperature is not practically significant when comparing a front panel door with 63% open area to an open configuration wherein no door is present. Such result indicates that providing a perforated panel, more specifically a perforated panel door, with a percent open greater than 63% does not provide an appreciable increase in effective cooling for the equipment stored in the enclosure.

When designing an equipment enclosure, many factors are taken into consideration. Such factors include enclosure stability and security and thermal management of equipment stored in the enclosure. As mentioned previously, it is important that thermal energy is able to be removed from equipment in the enclosure. Typically the thermal energy is removed by air passing over the equipment in the enclosure. It is generally understood that an enclosure is more stable and secure if it has a front panel. In addition, a front panel constructed of a relatively thick material is more stable and secure than a front panel constructed of a relatively thin material.

Therefore, the idea that a perforated front panel having 63% open area provides effectively as much sensible cooling ability as a perforated panel with greater percent open area or no panel at all is extremely important to enclosure designers and manufacturers. Previously it was thought that stability and security provided by a front panel, e.g., front panel door, would have to be sacrificed in high density equipment configurations in order to provide the maximum amount of airflow through the equipment, and thus the maximum amount of sensible cooling for the equipment. However, the experimental tests performed and described herein provide results that counter this idea. The test results show that providing a perforated panel door having a percent open area of 63% essentially provides the same airflow and the same amount of sensible cooling to equipment in an enclosure as removing the door altogether.

Using the information discovered about how percent open area affects airflow through a panel, an enclosure designer may follow the following steps when designing an electronic equipment enclosure. The designer will identify at least one panel of the electronic equipment enclosure through which air is intended to flow. This panel may be the front panel or another panel of the enclosure. Further, the panel may be a door panel or a fixed panel. After identifying the panel through which air will flow, the designer will determine the design parameters of the panel. Based on the information provided herein, the designer should establish a maximum ratio of open area to closed area of about 63% for the identified panel. The designer can then determine one or more other parameters of the design of the identified panel in view of the established maximum ratio of open area to closed area. For example, the designer may select a particular material of construction or may select a panel of a particular thickness, i.e., of a particular rigidity. After the design decisions are made, the designer will provide a panel constructed according to the determined design parameters.

The designer may repeat the steps outlined above for designing multiple enclosures. In addition, the designer may then design and construct the entire enclosure based on the parameters that are selected for the panel. Using a panel with a maximum percent open of 63% allows the designer to set one parameter and then design other features of the enclosure, including other parameters of the panel, more freely. Ordinarily a designer would be continually trying to increase the percent open area of the selected panel at the expense of other design parameters of the enclosure. With the information provided herein, a designer does not have to continuously worry about trying to further increase the percent open area. The designer can start with a panel having a maximum of about 63% open area and design the rest of the enclosure using this fixed parameter.

It is further extrapolated from the results described herein that similar benefits may be obtained from panel designs having open area to closed area ratios lying between 60% and 70%. That is, a designer may first set a maximum percent open of between 60% and 70% for one or more panels of an enclosure and then design other parameters of the panel more freely.

Such a design scenario, and a perforated panel resulting from such a design scenario, may be particularly appropriate in developing and providing various electrical equipment enclosures wherein the flow of air is to be carefully planned and controlled for maximum efficiency and maximum use of passive means for achieving such efficiency. For example, commonly-assigned U.S. application Ser. No. 11/533,359, the entirety of which is incorporated herein by reference, discloses an electronic equipment enclosure that includes a frame structure formed from a plurality of support posts and at least partially enclosed by a plurality of panels, the panels including at least side, top and back panels defining an enclosure having a top, a bottom and a rear thereof, wherein the top panel includes an opening therethrough that is rectangular in shape; and an exhaust air duct extending upward from the top panel of the enclosure, wherein the exhaust air duct is rectangular in cross-section and is disposed in surrounding relation to, and in fluid communication with, the top panel opening; wherein the exhaust air duct is adapted to segregate hot air being exhausted from the enclosure from cool air entering the enclosure, thereby improving thermal management of the enclosure. In designing such an enclosure, it may be particularly useful to design a front panel with a maximum of about 63% open area and to design a 100% closed back panel. Using the design scenario of the present invention, air flow through the front panel and into the enclosure, and then out the top of the enclosure through the exhaust air duct, is maximized while permitting such design parameters of the front panel as construction material, thickness, reinforcement elements, and the like to be optimized without further regard to maximizing air flow.

Similarly, commonly-assigned U.S. application Ser. No. 60/746,971, the entirety of which is incorporated herein by reference, discloses an electronic equipment enclosure above which is supported an above cabinet barrier to provide a physical barrier that prevents the recirculation of hot air over the top of the enclosure. As disclosed therein, such an arrangement may be particularly useful in maintaining a "hot aisle/cold aisle" approach to data center design, and as such it may be particularly useful to design both a front panel and a rear panel with a maximum of about 63% open area. Once again, using the design scenario of the present invention, air flow, from a cold aisle through the front panel, through the interior of the enclosure and through the rear panel into a hot aisle, is maximized while permitting such design parameters of the front and rear panels as construction material, thickness, reinforcement elements, and the like to be optimized without further regard to maximizing air flow.

Of course, the design methods of the present invention are equally applicable to a wide variety of other enclosure designs without departing from the scope of the present invention.

EXAMPLES

Example 1

In a data center environment, airflow and temperature tests were performed on a 7 foot enclosure which was capable of containing up to twelve 8-blade server chassis. Each chassis occupied 3 rack mount units (RMU) and included four horizontally aligned fans. For the testing, the fans provided an effective flow rate of approximately 2800 CFM. The enclosure had the chassis installed in RMU 10 through 45.

The equipment stored in the enclosure require a peak inrush current of 10A; however, a nominal draw between 4.5 and 6.5A is typical for each chassis. The actual electrical current supplied to the enclosure could not be measured; however, based on the product literature, the enclosure load was estimated to be within the range of 6.5 kW and 9.4 kW.

Each equipment chassis included four fans, which provided the airflow for the enclosure. The temperature at the air intake and exhaust location for each fan of three exemplary chassis were measured. Additionally, the air velocity was measured at the exhaust location of each fan of the exemplary chassis. The exemplary chassis were as follows: one near the bottom of the enclosure (RMU locations 10-12), one near the middle of the enclosure (RMU locations 30-32) and one near the top of the enclosure (RMU locations 43-45). The airflow and temperature measurements were taken using a turbine-type blade anemometer at the rear of the enclosure and at the chassis inlets for each of the exemplary chassis.

The data collected during the test is summarized in FIGS. 3-5. FIG. 3 is a tabular illustration depicting measured data for a test enclosure similar to the enclosure of FIG. 1 but with the door removed. FIG. 4 is a tabular illustration depicting measured data for the test enclosure wherein a front panel door with 63% open area was attached thereto. FIG. 5 is a table showing the flow reduction for the 63% open door panel of FIG. 4 calculated as a percentage of the flow reduction for the 100% open configuration of FIG. 3. In the tables of FIGS. 3 and 4, "Delta T" is the difference in air temperature measured at the exhaust of the equipment relative to the inlet. By knowing the change in temperature coupled with the rate of air being transported through the equipment, the power dissipation rate can be calculated with the previously-described equations.

As can be seen from respective columns of the table in FIG. 5, the results show that the airflow rates did not decrease appreciably when the door panel was removed from the enclosure. In fact, some of the airflow rates were actually lower with the 6300 open panel in place than when the front door was omitted altogether (100% open). This anomaly was unexpected and was attributed to the timing differential between tests coinciding with both the heat of the day and the heavier transaction load on the servers. Unfortunately, the temperature readings were not as instructive as desired because of the anomalous results. Nonetheless, as can be seen in FIGS. 3-5 and more directly in FIG. 5, the 6300 open door panel had, at most, a very small effect on reducing cooling airflow. For each chassis, the percent reduction in flowrate was less than about 1%.

Figure 6:
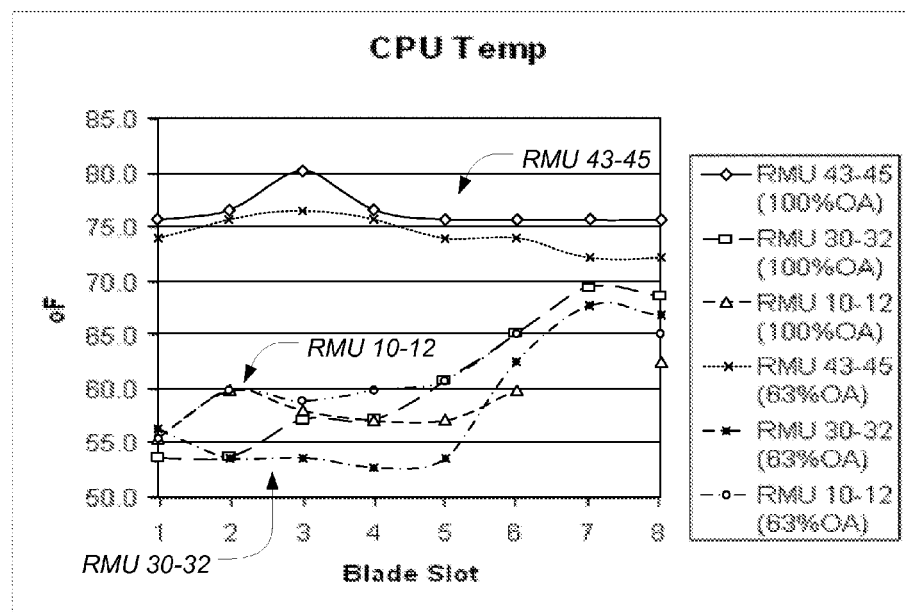
Figure 7:
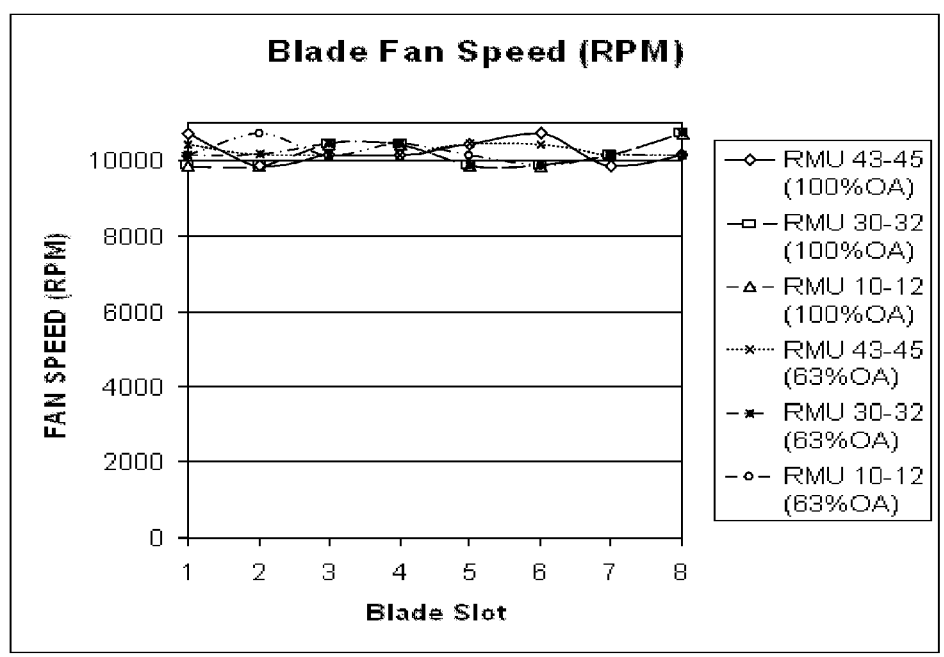
FIG. 7 is a graphical illustration depicting fan speed as a function of blade slot.

In addition, chassis temperatures and fan speeds were monitored directly through the chassis's operating system. FIGS. 6 and 7 show the results of these measurements. FIG. 6 is a chart showing CPU temperature as measured for each blade slot. FIG. 7 is a chart showing fan speed as measured for each blade slot. As is shown, the temperature and fan rate remained relatively constant at each RMU location when the 63% open panel was compared to the open configuration.

Example 2

A controlled test was designed and executed to determine the effect on exhaust airflow and temperature of using front panel doors with varying open area percentages.

The test environment was the center section of an empty, multi-compartment enclosure. Four different front panel door configurations were tested: a vented plexiglass front panel door with 8% open area, a perforated metal front panel door with 40% open area, a perforated metal front panel door with 63% open area, and the front panel door being removed which provided 100% open area "open configuration").

A plate was fabricated to hold twelve axial flow fans within the space (14 RMU) available in the center enclosure section. Axial flow fans were used because these fans are commonly found in rack-mounted equipment in contemporary data centers. Squirrel cage fans are also commonly found in rack-mount equipment. The conclusions drawn from this experimental test would have been the same if squirrel cage fans had been used because squirrel cage fans are less sensitive to flow restriction. Cardboard and duct tape were used to seal off any air leaks through the fans or the plate. Each of the fans was capable of ~100 CFM in a free condition.

A horn was attached to a turbine anemometer at the rear of the enclosure in order to measure flow through one of the fans for each of the four various front panel door configurations in feet per second. Flowrate data was taken with varying numbers of fans activated to simulate varying airflow rates through a 45 RMU enclosure. The fans were activated as follows: 12, 10, 8 and 6 fans were activated in the enclosure to simulate flows of approximately 3600, 3000, 2400, and 1800 CFM, respectively. In addition, the inactive fans were covered with duct tape to prevent air leakage for the tests when fewer than twelve fans were active. Two data points were captured for each flow rate and door configuration combination. In addition, for each of the various fan activation levels and door configurations wherein a door was present, the flowrate was measured for the open configuration in order to be able to accurately compare each door configuration wherein a door was present to the open configuration. The data points were averaged to estimate the flow rate in CFM.

Figure 9:
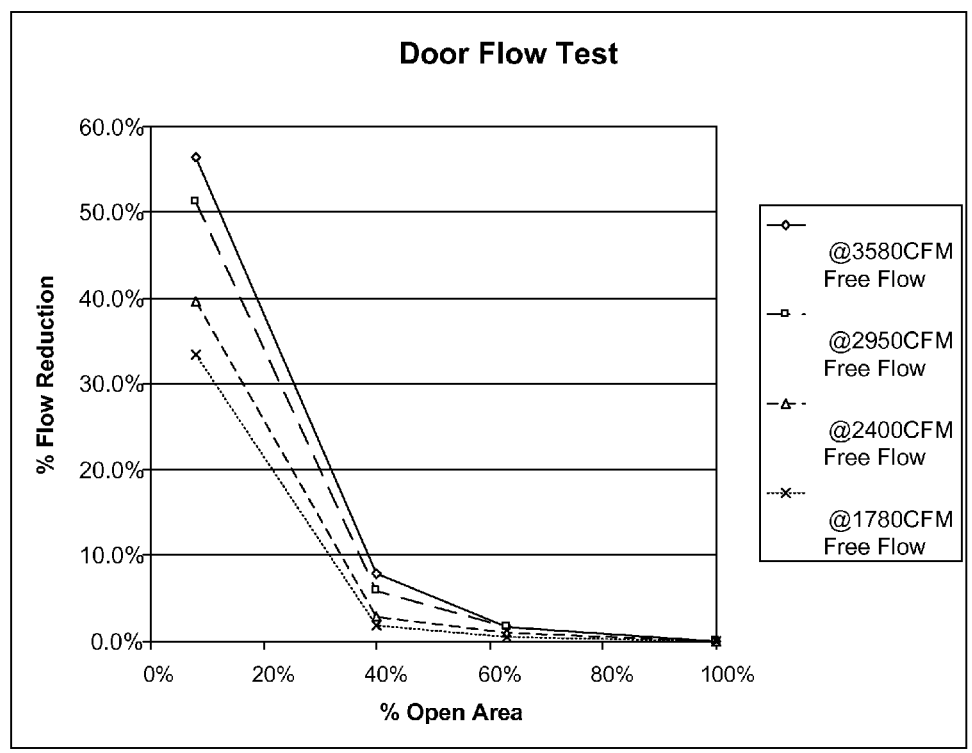
FIG. 9 is a graphical illustration depicting percent flowrate reduction for panels having a percent open area ranging from 0-100 %.

FIG. 8 is a table providing raw flow rate data and calculated data indicating simulated flowrate and percent flowrate reduction. The percent flowrate reduction is in reference to a panel having 100% open area, i.e., no panel. FIGS. 8 and 9 use the data provided in FIG. 3 to show percent flowrate reduction as a function of percent open area. FIG. 9 is a chart showing percent flowrate reduction for panels having a percent open area ranging from 0-100%, and FIG. 10 is a chart showing percent flowrate reduction for panels having a percent open area ranging from 40-100%.

Figure 10:
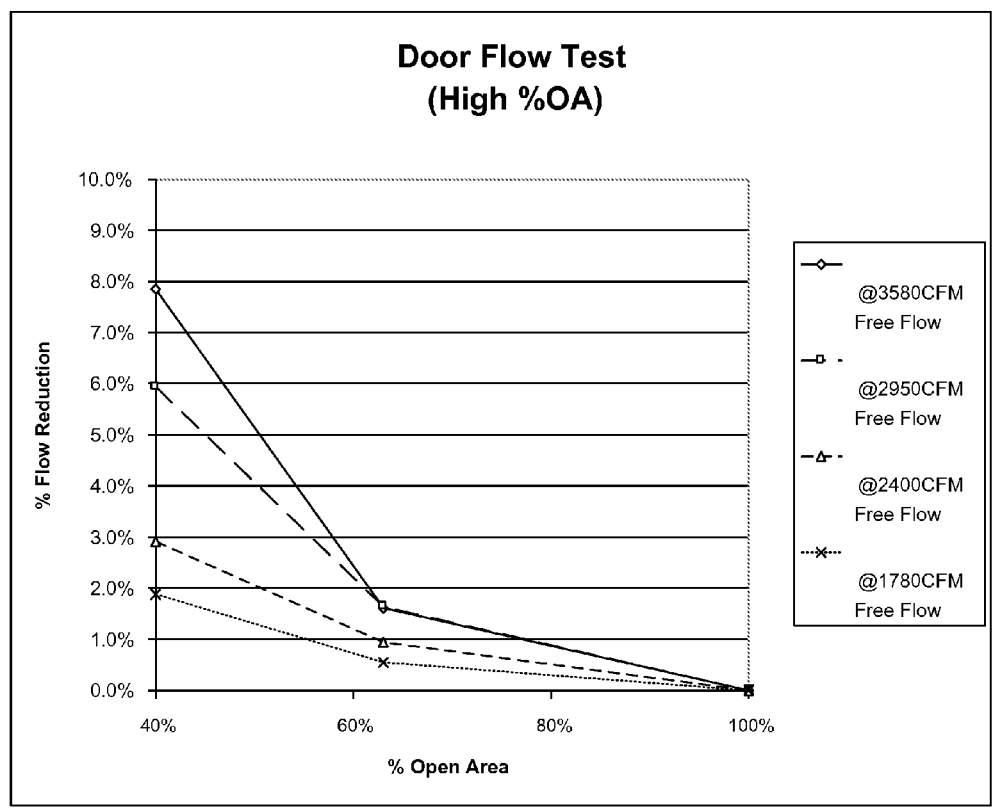
FIG. 10 is a graphical illustration depicting percent flowrate reduction for panels having a percent open area ranging from 40-100%.

As is shown in FIGS. 8-10, the data confirms the findings from the less-controlled data center tests and specifically indicates that for a flowrate of 3600 CFM a maximum flow efficiency improvement of only 1.6% was seen in going from 63% open panel to 100% open configuration. At 1800 CFM, the improvement from a 63% open panel to a 100% open configuration dropped to 0.5%.

FIG. 11 is a table providing calculated theoretical flowrate and cooling information based on measured flowrate data from the controlled flowrate test. Using the flowrate information from the above-described test, it was desired to calculate a theoretical cooling amount for each of the door configurations. More particularly, the calculated percent reduction in flowrate for the maximum flowrate for each door configuration was used to calculate the theoretical increase in processor temperature due to door airflow restriction caused by each door configuration. The theoretical cooling for the open configuration was then compared to the theoretical cooling for each of the door configurations.

To begin the cooling calculations, known flowrate data was obtained from the equipment manufacturer of a commonly available blade chassis. The equipment manufacturer provides literature stating that each of the blade chassis requires an airflow of 520 CFM. A seven foot enclosure, such as the one used in the airflow test, is able to hold six of these blade chassis. Therefore, the air required for a seven foot enclosure filled with these blade chassis is 3120 CFM. Using the 1.6% flow reduction number calculated in the airflow test for the 63% open door panel, a theoretical airflow rate of 3070 CFM is calculated for a 63% open door panel. The calculated theoretical flowrates for the 8% open door panel and 40% open door panel are provided in FIG. 11.

A typical maximum power load for a 45 RMU enclosure with a typical type of equipment installed therein is 26.6 kW. Equipment manufacturers have exceeded this power requirement; however, it is a common maximum power load and is useful for the purpose of determining theoretical cooling herein. Using the airflow equation provided above, along with the typical power usage and calculated flowrate, a theoretical cooling effect was calculated for each of the door configurations tested. As is shown in FIG. 11, a 63% open panel door induces a processor temperature increase of only 0.23° C than the 100% open configuration. This difference in temperature is statistically and practically inconsequential. These results suggest that a door panel with 63% open area provides essentially the same cooling effect as not having a door panel present at all.

Figure 12:
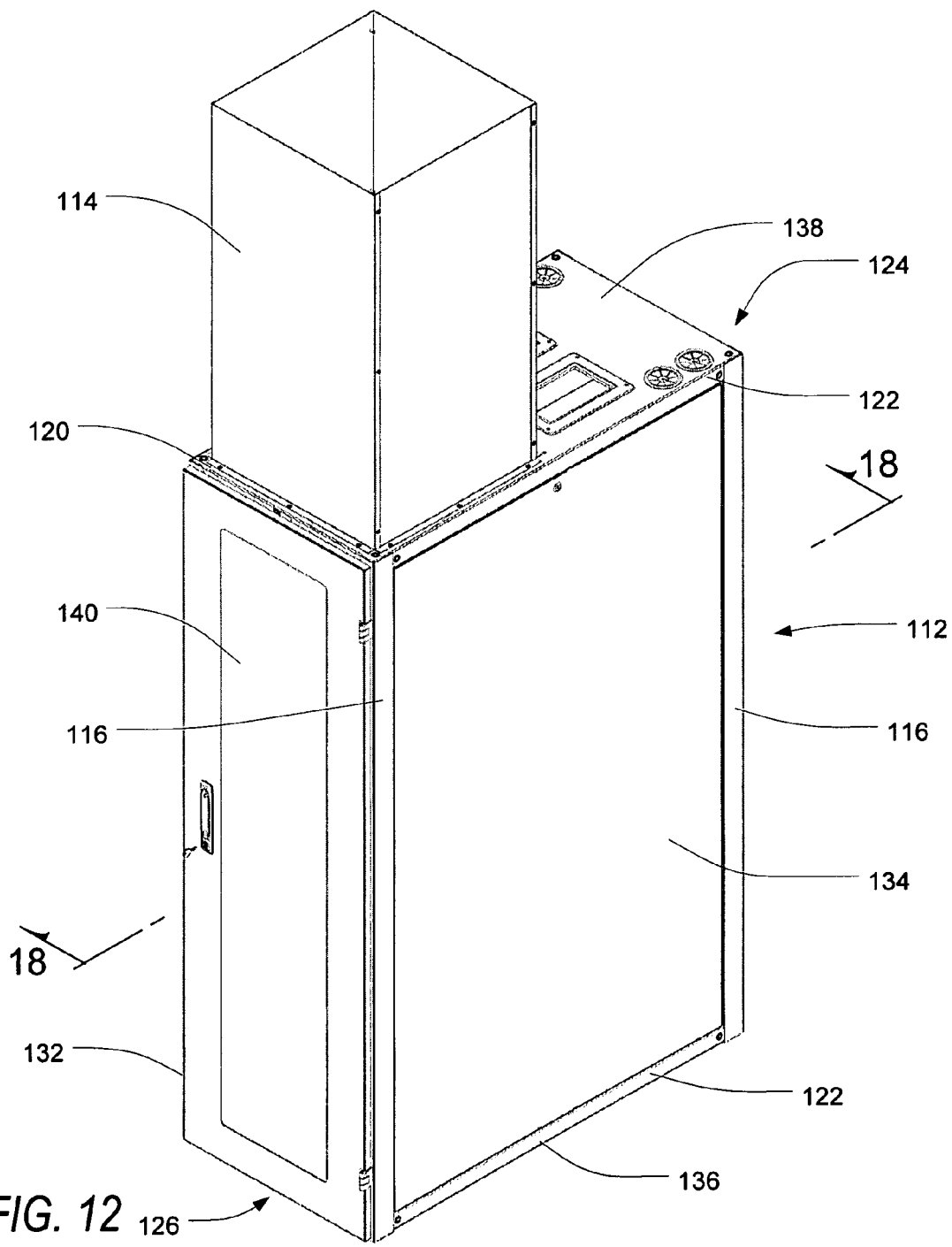

FIGS. 12-17 are various views of a ducted exhaust equipment enclosure 110 in accordance with a preferred embodiment of the present invention. More particularly, FIG. 12 is a rear isometric view of such a ducted exhaust equipment enclosure 110, and FIGS. 13-17 are a left plan view, rear plan view, front plan view, top plan view and bottom plan view, respectively, of the ducted exhaust equipment enclosure of FIG. 12. As shown therein, the ducted exhaust equipment enclosure 110 includes a four post frame structure 112 having panels 132,134,136,138,140, more fully described hereinbelow, partially enclosing the enclosure 110, attached thereto and an exhaust air duct 114 extending upwardly from the top of the enclosure 110.

The four post frame structure 112 may be of conventional design and construction. As shown and described, the four post frame structure 112 includes four vertical support posts 116, upper and lower front cross members 118, upper and lower rear cross members 120 and two pairs of upper and lower side cross members 122. Each vertical support post 116 includes a plurality of cross member attachment apertures at each end. Two of the vertical support posts 116 are connected together at their upper and lower ends by the upper and lower front cross members 118, respectively, and the other two support posts 116 are connected together at their upper and lower ends by the upper and lower rear cross members 120, respectively. The front cross members 118 and their respective support posts 116 thus define a front frame 124, and the rear cross members 120 and their respective support posts 116 define a rear frame 126. The front and rear frames 124,126 may then be connected together at their respective corners by the upper and lower side cross members 122.

Any known connection means may be used to join the various members together. One example of such a connection means is illustrated in FIGS. 12-17. Although not illustrated herein, at least one other example of conventional connection means is described in commonly-assigned U.S. Pat. No. 6,185,098, the entirety of which is incorporated herein by reference. Although likewise not illustrated herein, the precision and the stability of each of the corners of at least some types of four post frame structures may be enhanced by utilizing a self- squaring corner attachment bracket such as that disclosed by the commonly-assigned U.S. Pat. No. 5,997,117 entitled "RACK FRAME CABINET," the entirety of which is hereby incorporated by reference.

It will be evident to the Ordinary Artisan that other structures may be used to form a frame structure on which panels may be mounted to form an enclosure. For example, in at least one embodiment (not illustrated), a frame structure may be formed from only two support posts.

Figure 18:
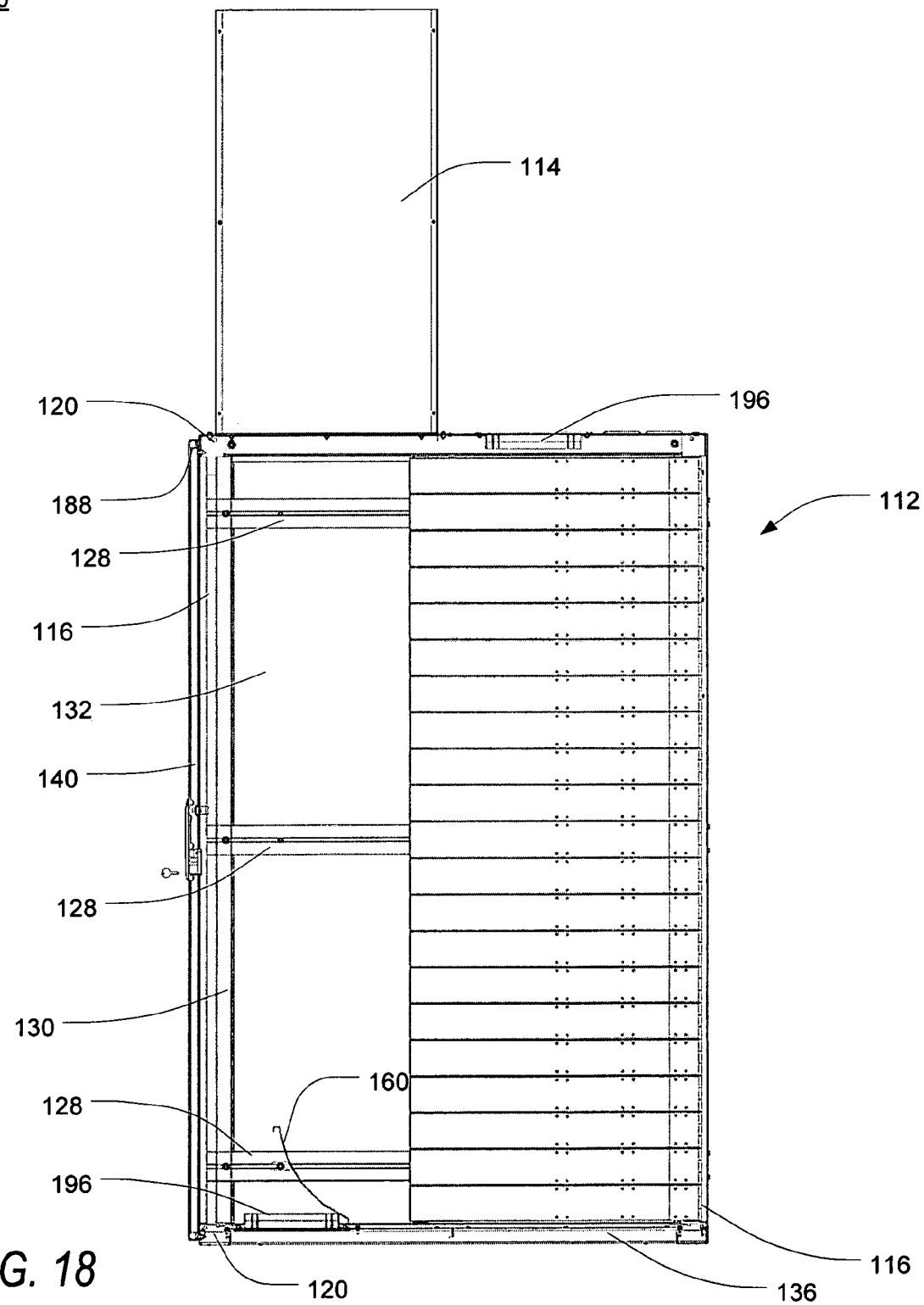

FIG. 18 is a left side cross-sectional view of the ducted exhaust equipment enclosure 110 of FIG. 12, taken along the line 18-18. As perhaps best seen in FIG. 18, the four post frame structure 112 farther comprises three pairs of horizontal mounting rails 128. Each horizontal mounting rail 128 includes a slot running substantially its entire length. In addition, three pairs of vertical mounting rails 130 are mounted to the horizontal mounting rails 128 using suitable fasteners held in place in the slots of the horizontal mounting rails 128. Each vertical mounting rail 130 preferably includes a series of threaded mounting apertures, arranged in evenly-spaced sets, extending along substantially its entire length for use in mounting electronic components, peripheral devices, cable brackets, additional mounting members, or the like thereto. It is contemplated that the number of horizontal and vertical mounting rails is variable. For example, an enclosure may include two horizontal mounting rails and two vertical mounting rails. Further, although the number of horizontal mounting rails is equal to the number of vertical mounting rails in the two examples mentioned herein, it is not necessary that the number of mounting rails be equal. It is further contemplated that, alternatively, each horizontal mounting rail may include one or more rows of mounting apertures extending along its length.

Figure 15:
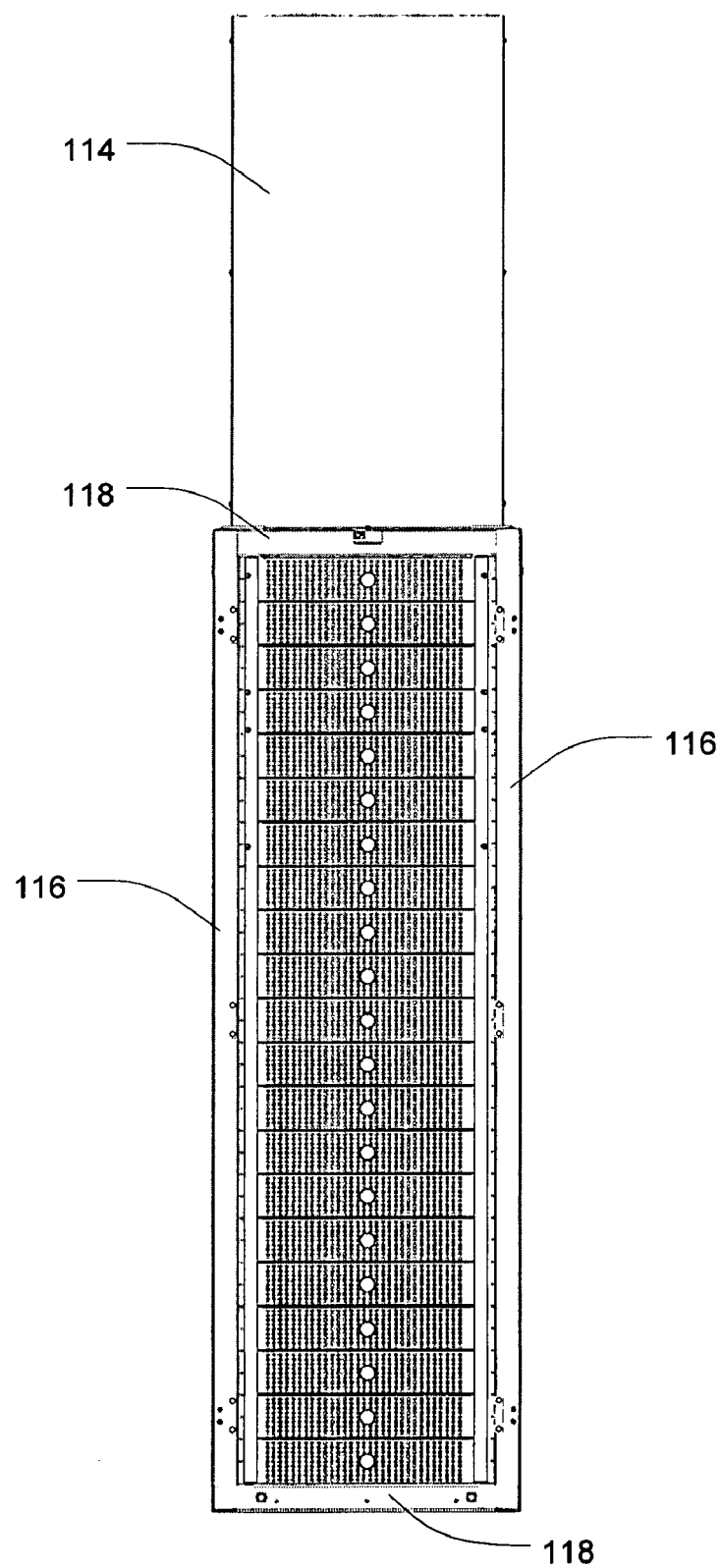
Figure 17:
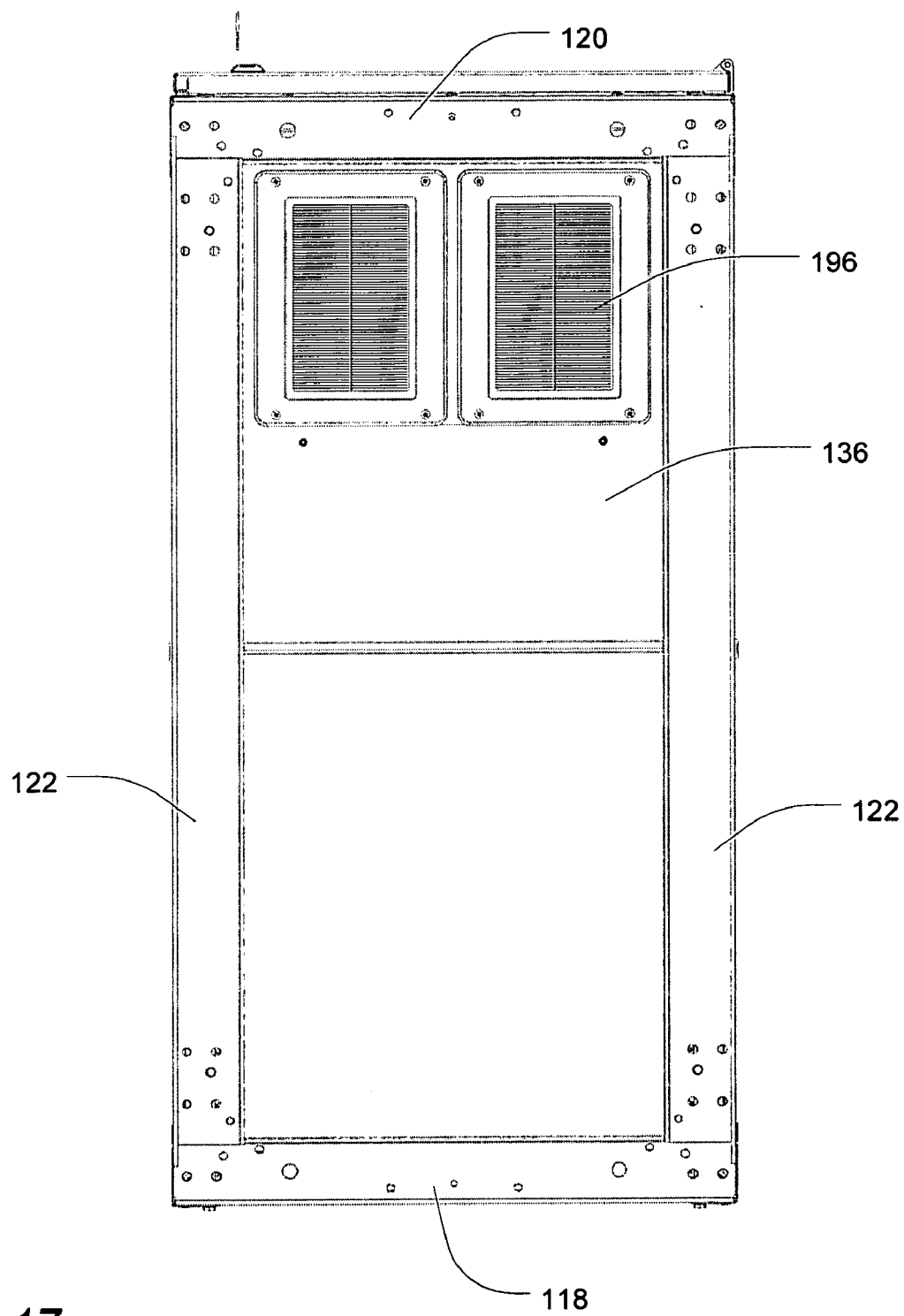

With particular reference to FIGS. 12 and 17, the enclosure 110 includes a right panel 132, a left panel 134, a bottom panel 136, a top panel 138 and a back panel 140, all attached to the frame structure 112, which partially enclose the enclosure 110. The right and left panels 132,134 are similarly dimensioned and the bottom and top panels 136,138 are similarly dimensioned, though differently constructed. As is shown in FIG. 15, a front of the enclosure 110 is open, therefore, the enclosure 110 is not completely enclosed. In a contemplated variation, the enclosure 110 may include a perforated or ventilated front panel (not illustrated). The Ordinary Artisan will understand that either variation of a front panel is operative to provide a path for air to enter the enclosure 110 for cooling the components contained therein. Further, although in the illustrated arrangement the back panel 140 is, in fact, a lockable door, it will be evident to the Ordinary Artisan that alternatively other types of doors and panels may be substituted for the various panels, and that one or more of the illustrated panels (such as one or both side panels 132,134) may in some cases be omitted altogether (such as in a row of two or more adjoining enclosures 110). It is, however, preferred that the back panel be solid, i.e., substantially air impervious, so that heated air is prevented from escaping through the door as further described hereinbelow. Any known connection means may be used to join the panels to the frame structure 112, including the back door panel 140.

Figure 16:
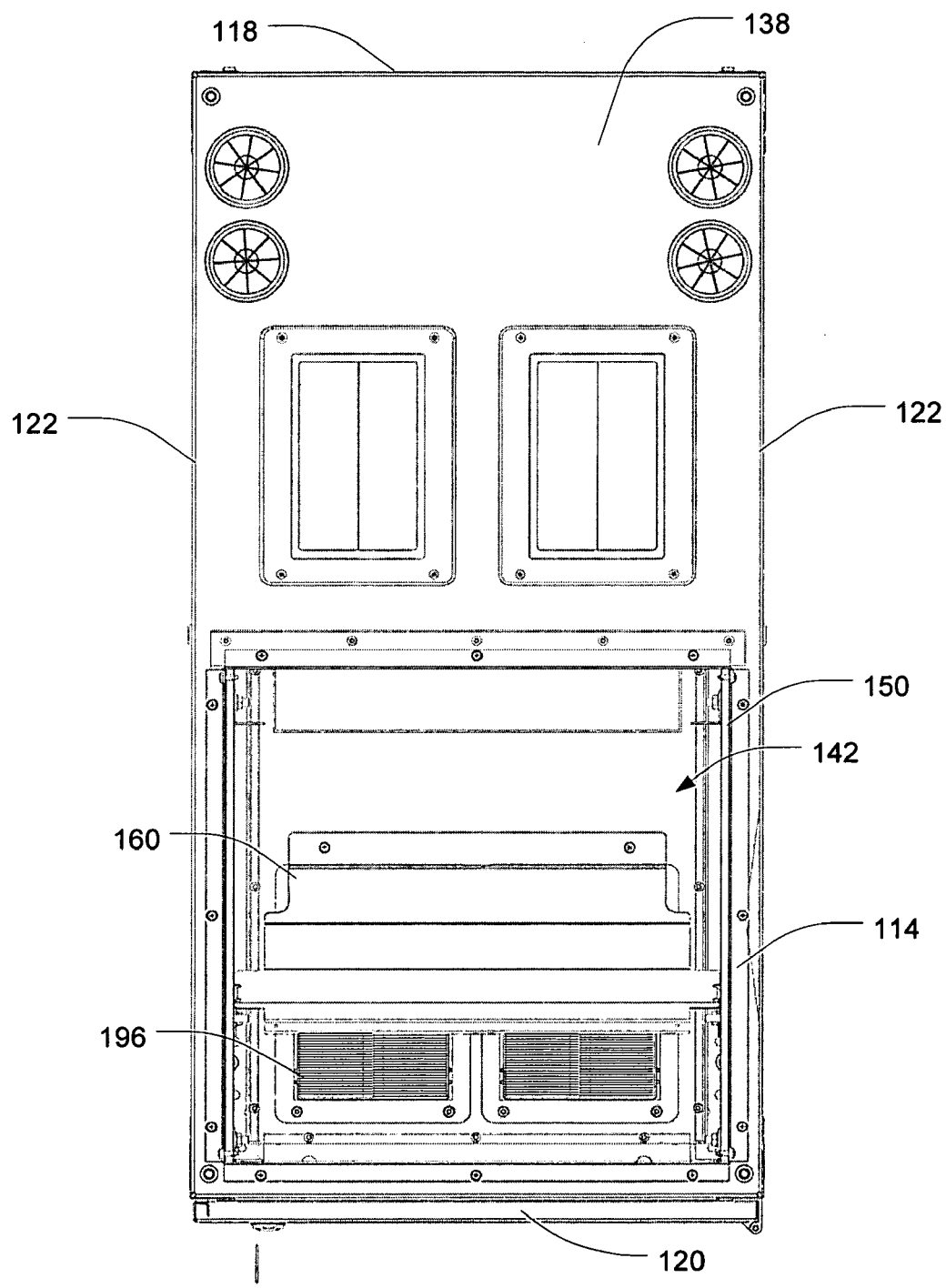

With reference to FIG. 16, the top panel 138 of the enclosure 110 includes a rectangular shaped opening 142 disposed adjacent the rear of the enclosure 110. The opening 142 is an exhaust opening and is intended to provided an outlet for air being exhausted from the enclosure 110, as further described hereinbelow.

Figure 19:
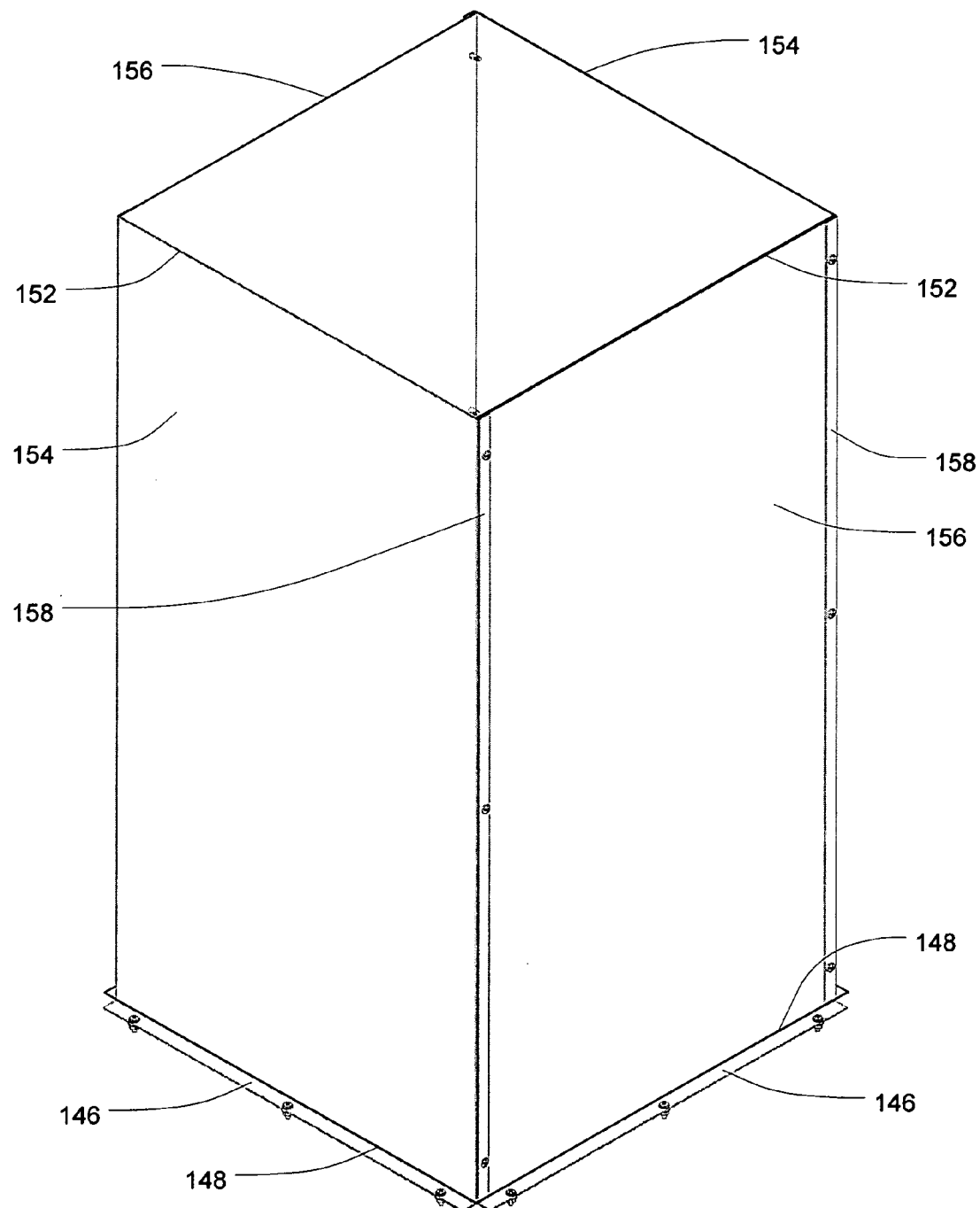

As perhaps best seen in FIG. 12, the opening 142 of the top panel 138 is surrounded by, and in fluid communication with, the exhaust air duct 114. FIG. 19 is an isometric view of the exhaust air duct 114 of FIG. 12. The exhaust air duct 114 is generally rectangular in cross-section and has four generally planar panels 154,156 of substantially similar length forming a body thereof. The width of the front and rear panels 154 is selected to correspond to the width of the enclosure 110, with the width being as wide as possible and still be mountable to the top of the enclosure 110. The width of the side panels 156 of the exhaust air duct 114 are dependent on the length or depth of the enclosure 110 and in some cases the distance between the rear of equipment mounted inside and the rear of the enclosure 110. The panels 154,156 are preferably constructed of a smooth, stiff material providing a low-restriction exhaust air duct 114 that is self-supporting. Examples include, but are not limited to, aluminum or steel of a sufficient gauge to permit self-support. Significantly, unlike corrugated air ducts, the smooth nature of the material provides a surface that encourages, rather than hinders air flow. The exhaust air duct 114 is open at a bottom and top thereof to allow for unencumbered air passage there through. The rectangular cross-section and large size of the exhaust air duct 114 provides for a considerably larger cross-section than that of conventional cylindrical exhaust air ducts, and thus much greater flow-through. Further, the cross-section of the exhaust air duct 114 is therefore substantially the same as that of the top panel opening 142 to allow air to flow from the top panel opening 142 through the exhaust air duct 114 without encountering any obstruction. The exhaust air duct 114 segregates the hot exhaust air from cool air entering the enclosure 110 by directing it up and away from the enclosure 110.

Each of the panels 154,156 of the exhaust air duct 114 has a flange 146 at a bottom edge 148 thereof for attachment to the top panel 138 of the enclosure 110 around a rim 150 of the top panel opening 142. A top edge 152 of the exhaust air duct 114 may be connected to a room's return air duct, as shown schematically in FIG. 23. As will be evident to the Ordinary Artisan, it may be desirable to include additional features at the top edge 152 of the duct 114, such as a mounting flange (not shown) extending around the periphery thereof, to facilitate such connection. However, the self-supporting nature of the exhaust air duct 114 enables it to be positioned upright without any support from such a return air duct. Still more preferably, the height of exhaust air duct 114 may be adjustable for use in rooms with varying ceiling heights. In order to facilitate such adjustability, the exhaust air duct 114 may have a telescoping design or some other design capable of adjustability. Such adjustability may be further enhanced by the self-supporting nature of the exhaust air duct 114. In contrast, conventional air ducts must be attached at either end to a support because they are not self- supporting, therefore, conventional air ducts lose the freedom of adjustability that is available in the exhaust air duct 114 of the present invention.

Figure 20:
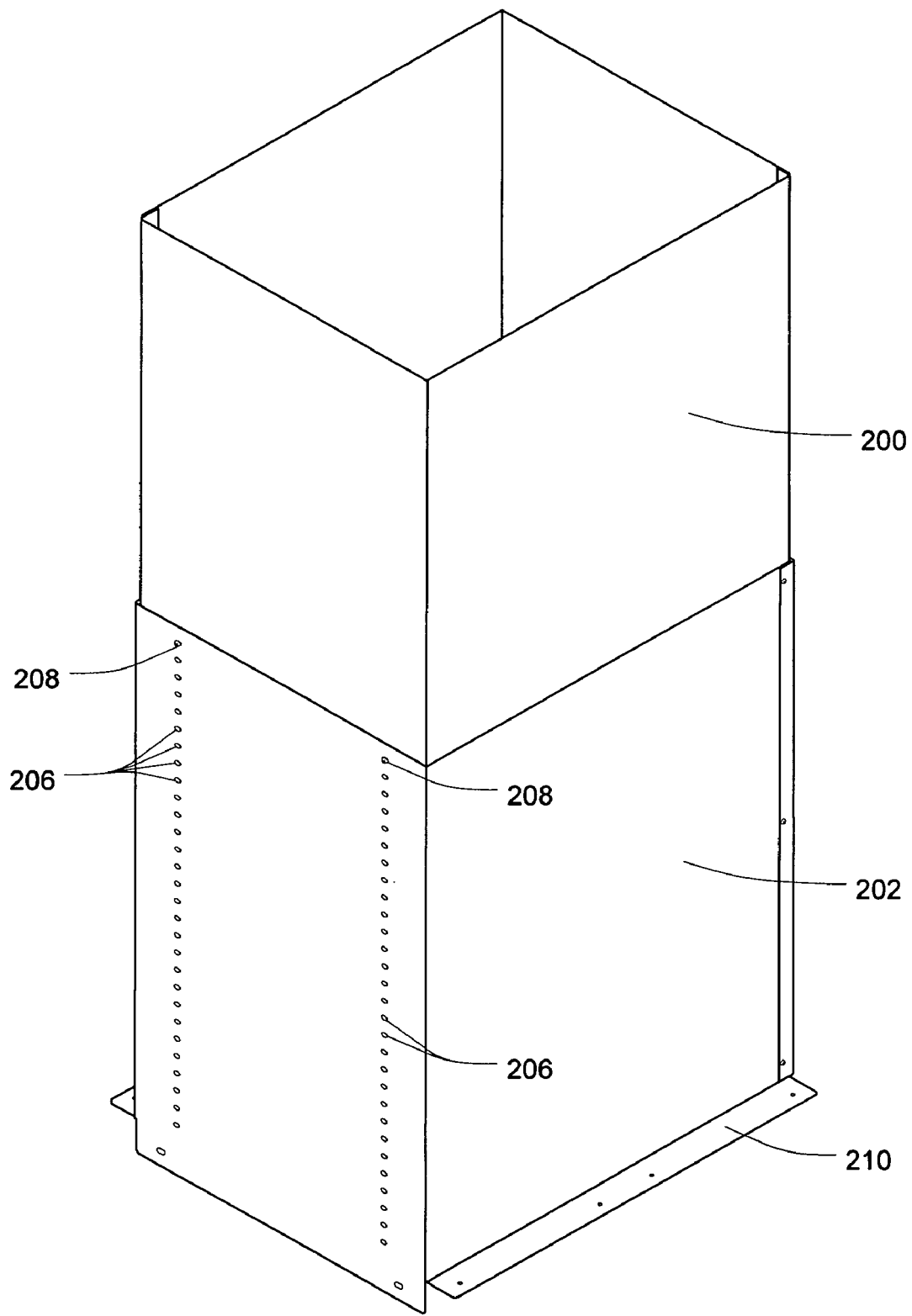

FIG. 20 is an isometric view of an exemplary telescoping exhaust air duct 198 for use with the ducted exhaust equipment enclosure of FIG. 12. The telescoping duct 198 comprises two duct sections 200,202 having a somewhat similar construction to that described above for the exhaust air duct 114. More particularly, both duct sections 200,202 are open-ended and have a rectangular cross-section defined by front and back panels and left and right panels. The telescoping duct 198 includes a first duct section 200 with a rectangular cross-section that is slightly smaller in cross-section than a second duct section 202, within which the first duct section 200 nests. The telescoping duct 198 preferably includes a means for fixing the total height of the duct 198 once it has been adjusted, i.e., once the relation of the first duct section 200 to the second duct section 202 has been decided. In the present embodiment, each of two opposing panels of the first duct section 200 includes a pair of openings (not shown), with each opening being disposed near opposite lower corners of the panels. These openings may be disposed in front and back panels or left and right panels, depending on the orientation of the telescoping duct 198 when it is installed in the enclosure 110. Each of two opposing panels of the second duct section 202 includes a pair of columns of openings 206, preferably evenly- spaced, that are disposed near side edges of the panels. When the telescoping duct 198 is assembled, the opposing panels of the first duct section 200 having the pair of openings described above are aligned with the opposing panels of the second duct section 202 having the columns of corresponding openings 206. In this arrangement, the openings of the first duct section 200 may be adjusted vertically until the openings are aligned with a desired set of openings 206 of the second duct section 202. Thus, the first duct section 200 may be moved upwardly or downwardly, thereby extending or retracting the height of the telescoping duct 198, until the desired height is reached. At this point, the four openings of the first duct section 200 should be aligned with four openings 206 of the second duct section 202 that lie in the same horizontal plane. Bolts or other fasteners 208, or some other similarly functioning connection means (such as a spring-loaded pin or the like) may be inserted through the aligned openings of the first 200 and second duct sections 202 to fix the height of the telescoping duct 198. If it is subsequently desired to adjust the height, the bolts 208 may be removed and the first duct section 200 slid upwardly or downwardly until the new desired height is reached.

In the telescoping duct 198, the second duct section 202 may include a flange 210 at bottom edges of the opposing panels that do not have the columns of openings 206. The telescoping duct 198 may be connected to the enclosure 110 using the flanges 210. In addition, the panels that include the columns of openings 206 may have a bottom edge that extends slightly lower than the bottom edges of the other panels. These bottom edges may extend into the opening 142 of the top panel 138 of the enclosure 110. As will be evident to the Ordinary Artisan, the dispositions of these elements may be changed as desired.

Referring back to FIG. 19, front and back panels 154 of the exhaust air duct 114 include additional flanges 158 at side edges thereof. The flanges 158 of the front and back panels 154 fold around side edges of the right and left panels 156 at the corners of the rectangular shaped exhaust air duct 114. Any known connection means, such as screws, may be used to join the exhaust air duct panels 154,156 using the flanges 158 of the front and back panels 154. This arrangement further improves the rigidity of the exhaust air duct 114.

Because of the positioning of the exhaust air duct 114 on the enclosure 110, the back panel 154 thereof is nearly vertically aligned with a vertical plane of the back panel 140 of the enclosure 110. Further, because the rectangular shape of the exhaust air duct 114 is similar to the rectangular shape of the back of the enclosure 110, exhaust air flows freely through the exhaust air duct 114. In contrast, in a conventional cylindrical exhaust air duct, air from the back of the angularly shaped enclosure, particularly the corners of the enclosure, must take a tortuous and winding path in order to exit the server enclosure. This relatively complex air flow scheme decreases the rate at which and the amount of air that may exit the enclosure. Further because the rectangular exhaust air duct 114 is similar in shape to the back of the enclosure 110 itself, it can be made larger in cross-section than conventional cylindrical ducts, thus allowing for more airflow through the exhaust air duct 114. Accordingly, the rectangular cross-section of the exhaust air duct 114 facilitates increased transfer of thermal energy from the enclosure 110 in comparison to conventional enclosures with conventional exhaust air ducts 114 because of the increased exhaust air flow rate and the decreased resistance to flow permitted by the size, shape and smooth panels of the rectangular exhaust air duct 114.

Figure 24:
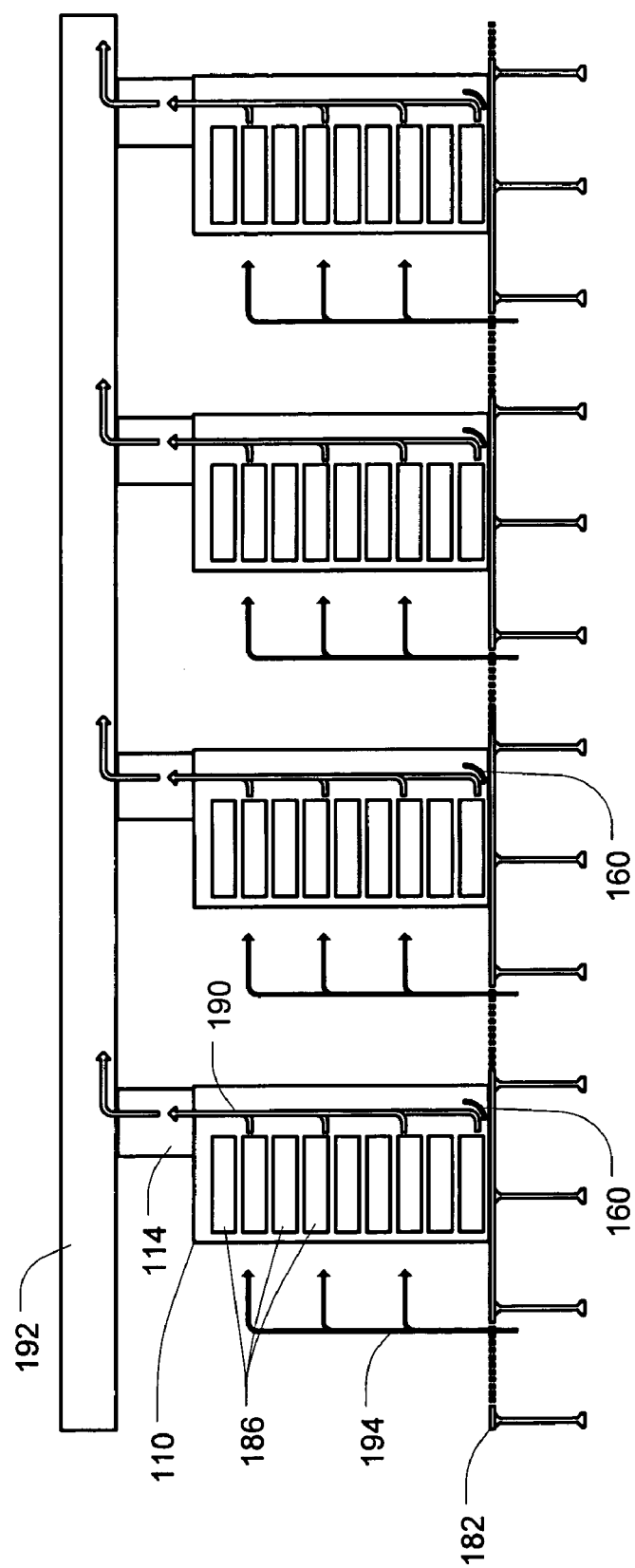

As shown in FIG. 24, the exhaust air duct 114 may be connected to a room's exhaust air removal system, which commonly includes a return air duct. However, the exhaust air duct 114 does not have to be connected to a return air duct. The enclosure 110 may vent directly into the room into which the enclosure 110 is placed. This approach is more useful in rooms that have high ceilings into which to vent the hot air, however, the natural buoyancy of hot air will keep the hot vented air at or near the top of the room into which it is vented.

The enclosure 110 may be used in connection with a hot aisle/cold aisle configuration of a data center or computer room. If a series of enclosures 110 are arranged in a row in such configuration, the exhaust air ducts 114 form a vertical wall rising from the tops of the enclosures 110 due to their size and shape. This vertical wall may serve as a barrier to recirculation, thereby improving the performance of the hot aisle/cold aisle thermal system.

Figure 21:
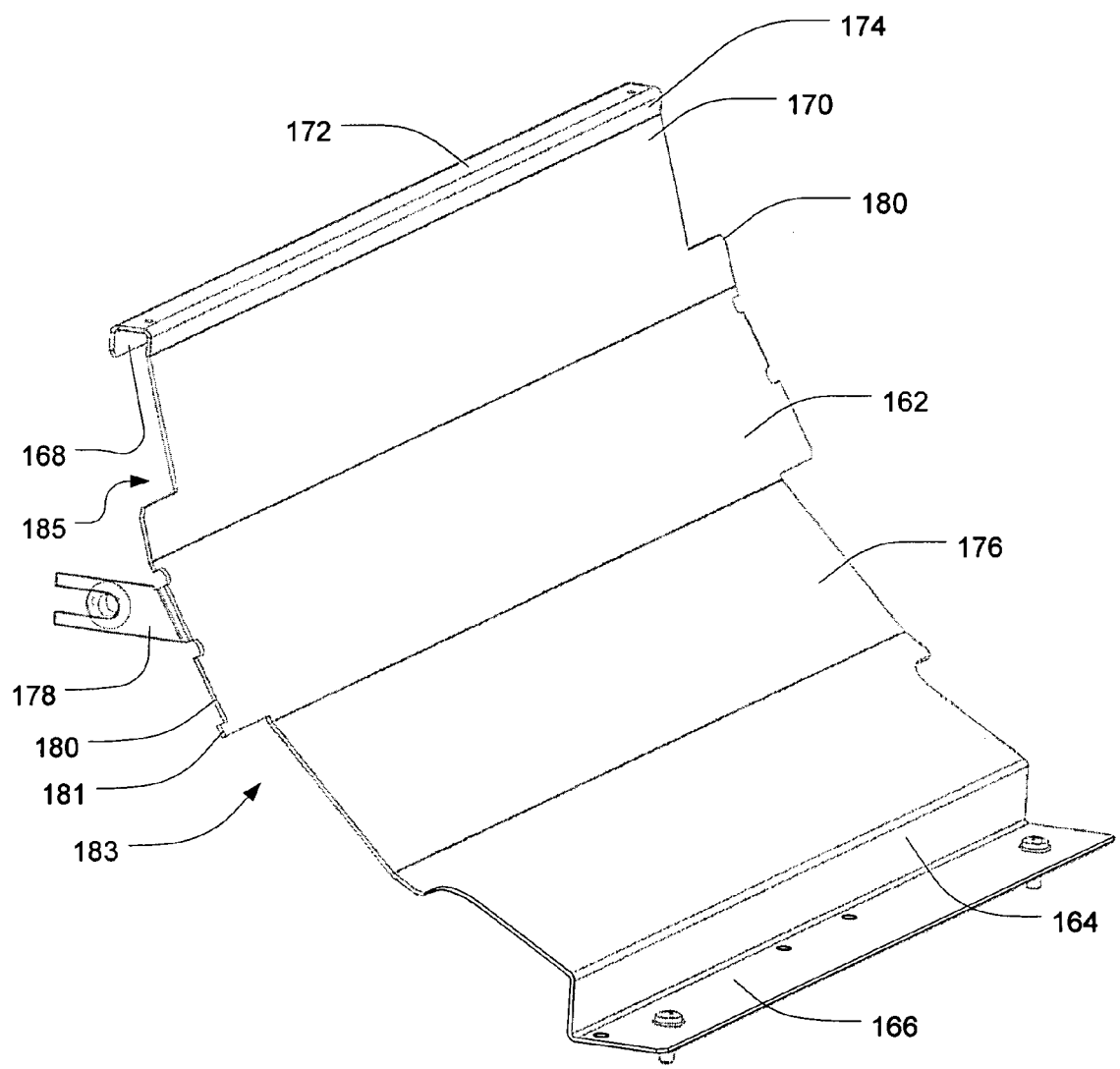

As seen in FIG. 18, the enclosure 110 may also include an air flow director or air diverter 160 located near the bottom of the enclosure 110 and generally directly beneath the opening 142 for the exhaust air duct 114. FIG. 21 is a front orthogonal view of the air diverter 160 of FIG. 18. As shown therein, the air diverter 160 comprises a planar panel 162 having a series of creases or bends therein so as to create a generally scoop-shaped structure. Preferably, the creases or bends are generally regularly spaced such that cross-section of the structure approximates an arc, as evident from FIG. 18. Of course, it will be evident to the Ordinary Artisan that alternatively the structure may, in fact, have a uniformly curved (non-planar) cross-section, but the use of a planar panel 162 that is bent or creased to approximate an arc cross-section may improve manufacturability. Further, it will be evident that while the present embodiment comprises a generally curved structure, it is important to note that the air diverter 160 may comprise any shape that creates a scoop effect for air flowing through the enclosure 110.

The air diverter 160 has a width that at its maximum is substantially the same as the distance between the horizontal mounting rails 128. The air diverter 160 includes a pair of wing elements 180 disposed opposite one another on opposite side edges of the air diverter 160. The wing elements 180 extend beyond the side edges of the air diverter 160 such that they essentially span the entire distance between the horizontal mounting rails 128. A bottom edge 164 of the air diverter 160 has a flange 166 for connecting the air diverter 160 to the bottom panel 136 of the enclosure 110. Any known connection means may be used to join the air diverter 160 to the bottom panel 136 of the enclosure 110. Alternatively, the air diverter 160 may be left unfastened to the bottom panel 136, thereby permitting the air diverter 160 to be relocated forward or backward from the location illustrated in FIG. 18. If left unfastened, it is useful to include means for preventing the air diverter 160 from being rotated upward by the forces applied by cables as described hereinbelow. One such means is a small protuberance 181 that may be included on the wing elements and that hooks underneath the horizontal mounting rails 128 to which the diverter 160 is attached as described below.

The air diverter 160 further includes a "U"-shaped channel member 168 disposed at a top edge 170 thereof. The channel member 168 includes a top surface 172 and two side surfaces 174 extending from the top surface 172. One of the side surfaces 174 is attached to the top edge 170 of the air diverter 160. The channel member 168 is arranged such that the top surface 172 thereof extends away from a front surface 176 of the air diverter 160. The channel member 168 provides rigidity for the air diverter 160.

The channel member 168 also serves another purpose, as next described. As can be seen in FIG. 18, the enclosure 110 includes a cable openings 196 located behind and beneath the air diverter 160 and in the top panel 138. Cables (not shown) used to power components or supply data to or from components stored in the enclosure 110 can be routed through the cable openings 196. In particular, it is contemplated that a substantial number of cables may be disposed between the back panel 140 of the enclosure 110 and the air diverter 160 and in fact, the back of the air diverter 160 may aid in forcing the cables toward the rear of the enclosure 110. Such cables may exert a considerable amount of tension on the back of the air diverter and particularly on the uppermost and/or rearmost surfaces of the channel member 168. If these surfaces are rough, they could potentially cause considerable chafing on the surfaces of the cables, thereby damaging them. Advantageously, because the distal edge of the channel member 168 is pointed downward, the cables instead make contact with the relatively smooth surfaces of the top and side surfaces 172, 174, thereby protecting the cables from damage. In this regard, in at least one alternative embodiment (not illustrated), the channel member 168 may be replaced by an arcuate member that provides a minimum radius of curvature, thereby preventing cables from being bent unnecessarily.

The air diverter 160 further includes a pair of connection tabs 178 disposed on the wing elements 180 thereof. The wing elements 180 are generally positioned at a height corresponding to the elevation of the lowermost horizontal mounting rail 128 within the enclosure 110, and the tabs 178 therefore provide a means for the air diverter 160 to be connected to a pair of horizontal mounting rails 128 of the enclosure 110 using the mounting rail slots, described previously and visible in FIG. 18. Further, any known connection means may be used to connect the air diverter 160 to the bottom panel 136 of the enclosure 110 as desired.

Notably, although not shown, because the wing elements 180 extend out from the side edges of the air diverter 160, the vertical mounting rails 130 may alternatively be disposed between the side edges of the air diverter 160 and the horizontal mounting rails 128 in the inset areas 183,185 located above and below the wing elements 180. Thus, the vertical mounting rails may be arranged by a user at nearly any location along the horizontal mounting rails 128 from the front to the back of the enclosure 110, other than where the wing elements 180 are present. The lower inset area 185 also provides another function, in that cables entering the bottom of the enclosure 110 may be routed forward almost immediately after entering the enclosure using the space provided by the lower inset area 185. In the absence of such a space, cables would have to be routed up and over the wing elements, thus making the cables unnecessarily long.

Figure 22:
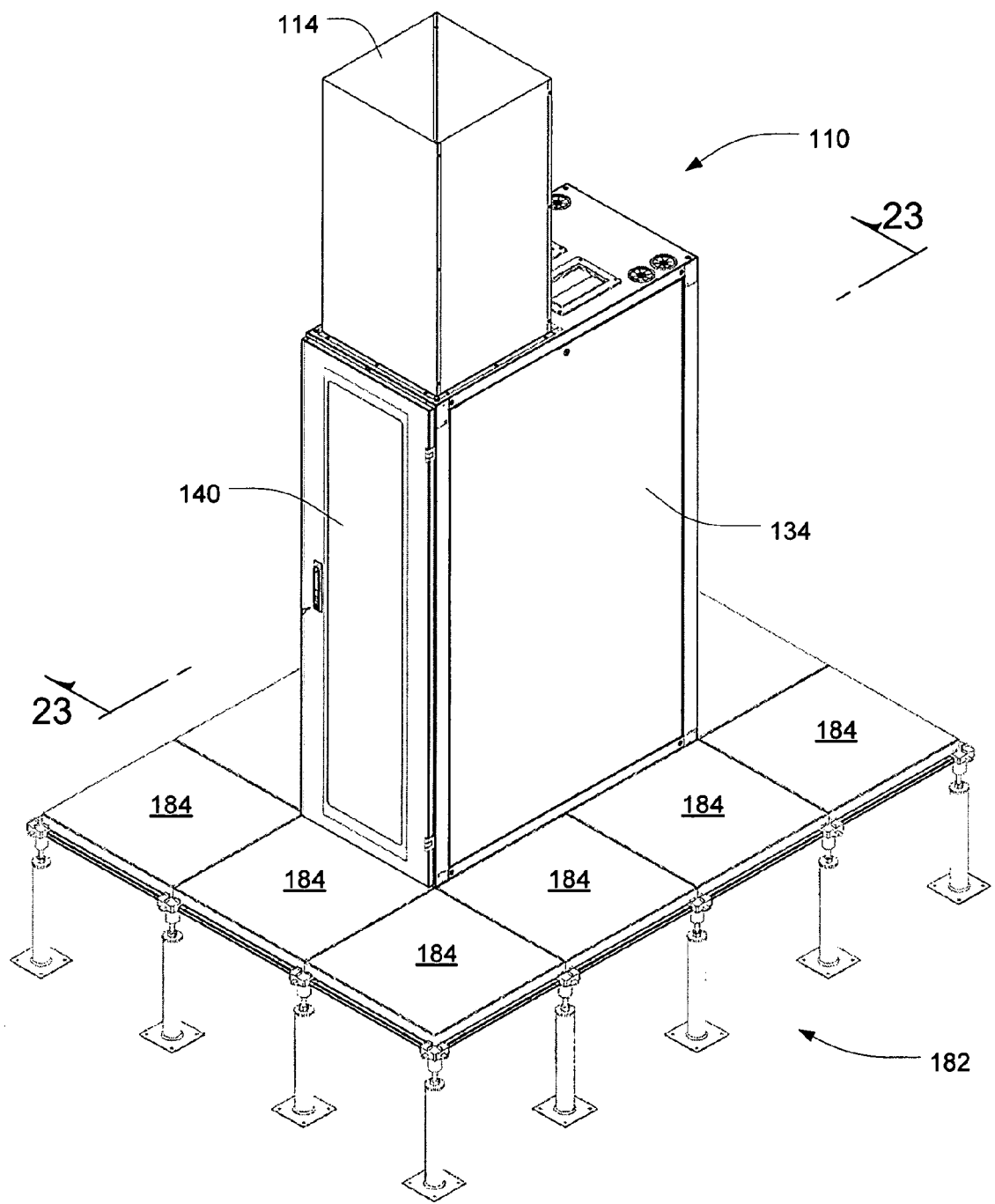
Figure 23:
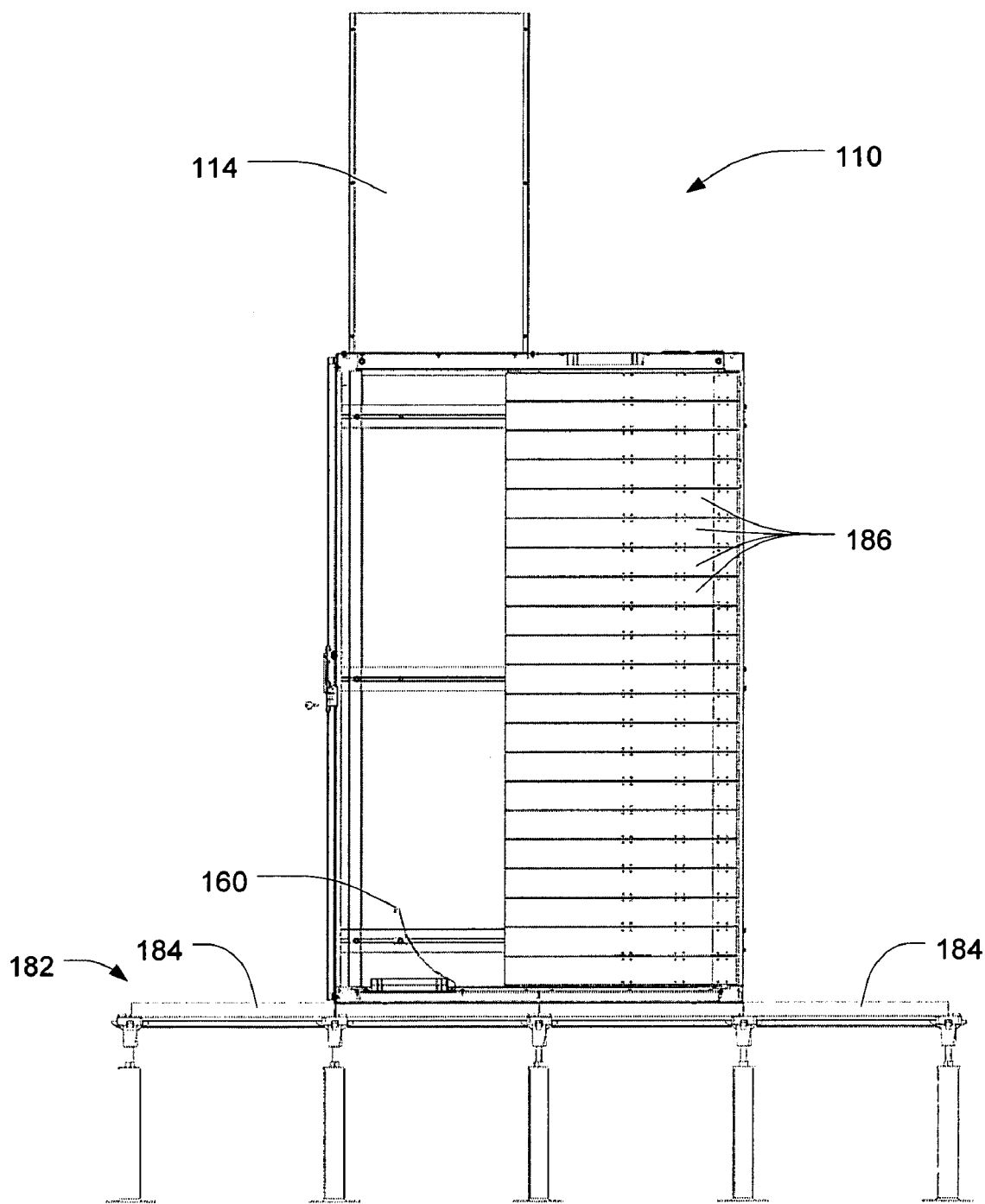

In use, the ducted exhaust equipment enclosure 110 is typically, though not always, installed on a raised floor 182. FIG. 22 is a rear isometric view of the ducted exhaust equipment enclosure 110 of FIG. 12, shown installed on a raised floor 182, and FIG. 23 is a side cross-sectional view of the ducted exhaust equipment enclosure 110 of FIG. 22, taken along the line 11-11. The raised floor 182 includes a plurality of floor panels or tiles 184 of standard size and conventional design, all supported above the permanent floor at a desired height. The floor tiles 184 conventionally include solid tiles as well as perforated or ventilated tiles, the latter of which are designed to permit cool air supplied from the space beneath the floor 182, commonly referred to as the raised floor plenum, to flow therethrough. In particular, a ventilated tile may be located directly in front of the enclosure 110 to provide the most direct path to the interior of the enclosure and the air intakes for the equipment 186 located inside. Further, although not specifically illustrated herein, the area directly underneath such an enclosure 110 is often left fully or partially open by eliminating one or more tiles 184, by using tiles 184 with large openings therein, or by using tiles 184 that are less than full-size.

FIG. 24 is a schematic illustration of a series of ducted exhaust equipment enclosures 110 showing cool air flowing in and hot return air flowing out. As shown in FIGS. 22 and 23 once one or more enclosures 110 are installed on the raised floor 182, electronic equipment 186 is installed in the various equipment enclosures 110, typically by attaching the equipment 186 to the vertical mounting rails 130, and operated normally. As described previously, the equipment 186 generates considerable thermal energy while it operates. The thermal energy is carried by air currents which may be forced or forcibly drawn out of the rear of the various active pieces of equipment 186 by internal fans (not shown), often supplemented by separate fans (not shown) mounted in or on the enclosures 110. The air-impervious rear door 140 prevents heated air from escaping out the rear of the enclosure 110 where it would mix with cool air outside and be drawn back through the enclosures 110. Heated air near the bottom of each enclosure 110 is further redirected upward by the air diverters 160. The heated air is then exhausted through the exhaust air ducts 114 as represented by arrows 190, and into the return air duct 192. Once there, the heated air is handled by the CRAC, sometimes in combination with additional ducts, fans, partitions, and/or other equipment (not shown).

At the same time, cool air, represented by arrows 194, flows up through the perforated tiles 184 and in through the front of the enclosure 110, thereby facilitating the flow of air through the enclosure 110 and cooling the equipment 186 mounted therein. Although not shown, cool air is often also guided through the openings directly beneath the enclosure 110. Care must be taken to force such air to the front of the equipment 186 to avoid letting it escape immediately up the back of the enclosure 110.

Thus, the ducted exhaust equipment enclosure 110 allows the components 186 stored therein to draw the required volume of air through the enclosure 110, and then directs the exhaust out of and away from the enclosure 110 thereby eliminating the problem of air recirculation. The ducted exhaust equipment enclosure 110 segregates hot exhaust air by directing it up an exhaust air duct 114 at the top rear of the enclosure 110. This approach delivers enhanced cooling of components resulting in a more efficient use of available cool air and better overall heat transfer away from components.

Preferably, and as shown in FIG. 24, the exhaust air duct 114 is connected to a drop ceiling return air plenum. However, this is not necessary where high ceilings can offer sufficient clearance for the return air to stratify above the cold air in the room.

Several benefits become obvious with this architecture. For example, enclosures 110 do not have to be oriented front-to-front and back-to-back along hot aisle/cold aisle rows, as they do with conventional hot aisle/cold aisle arrangements. This freedom allows enclosure arrangements to be driven by other infrastructure requirements. In addition, up to 10000 of the exposed floor can be perforated. Perforated tiles 184 can be located anywhere in the room. Using ducted exhaust equipment enclosures 110 allows the entire data center to be cold, i.e., no more hot zones. Cold intake air can be pulled from anywhere in the room. An enclosure 110 no longer has to obtain all of the airflow needed from the raised floor tile directly in front or adjacent to it. As such, airflow balancing issues are significantly reduced, if not, alleviated. By enabling cold air to be delivered through 1000o of the tile in the raised floor 182, it is contemplated that the airflow available to any given enclosure 110 can be doubled thereby doubling the heat load capacity of the enclosure 110.

It is important to note that because the ducted exhaust equipment enclosures can be used in data centers both with raised floors 182 or without raised floors 182, they are extremely versatile. The ducted exhaust equipment enclosures 110 can be used in rooms with or without a raised floor 182 and can be partially or completely cooled using a raised floor plenum or by an alternative cooling means such as ducts within a data center. Accordingly, the following scenarios are possible with the ducted exhaust equipment enclosures: 1) a data center wherein cold air is supplied using only a raised floor approach, 2) a data center wherein no raised floor is present and cold air is supplied using only alternative approaches to a raised floor, e.g., ducts in the room, 3) a data center wherein a raised floor 182 is present but cold air is supplied by ducts in the room, and 4) a data center wherein cold air is partially supplied by ducts in the room and partially supplied by a raised floor plenum.

Use of the ducted exhaust equipment enclosures 110 also creates the opportunity to deploy high density applications in a non-raised floor environment because cold air can be delivered directly into the room rather than through a raised floor. In addition, the use of ducted exhaust equipment enclosures 110 avoids any dependency on booster fans, with the accompanying concerns over additional heat loads, fan failure and redundancy, thereby reducing the cost of equipping a data center.

In the process described above, each air diverter 160 reduces or eliminates eddies that would otherwise be present in the hot return air at the bottom rear of the enclosure 110. Such eddies can cause computer components mounted at the bottom of the enclosure 110 to operate at a higher temperature than components mounted higher up in the enclosure 110. The air diverter 160 reduces or eliminates such eddies by turning hot return air upward in the direction of primary flow of hot return air. It is contemplated that intermediate half-scoop air diverters (not shown) may also be added at various vertical spacing locations along the back of the enclosure 110. These intermediate half-scoops of various sizes and shapes may be used to further improve air flow and air balance. Advantageously, although the exhaust air duct 114 may be used by itself, the various scoops help start the vertical flow of heated air up toward the duct 114, thereby making it function more efficiently than if used by itself.

The enclosure 110 may include additional features to aid in airflow management of the enclosure 110. One such feature is the inclusion of metal bracket seals 188 around the connection means used to connect the back door panel 140 to the enclosure 110. The seals 188 further ensure that exhaust air exits the enclosure 110 via the exhaust air duct 114 rather than through small openings around the connection means or edges of the door. Further, foam or rubber gaskets (not shown) may be added to, or may replace, the metal bracket seals 188 to create a further barrier to air release.

Another contemplated feature is a brush opening in the bottom panel 136 of the enclosure 110. Often an enclosure will have an opening in the bottom panel thereof for receipt of cables that provide power and other input or output to the components stored in the enclosure. Unfortunately, air is able to flow freely through the opening thereby altering the intended airflow scheme of the enclosure. It is possible to include a plurality of bristles extending inwardly from opposing sides of the opening such that exterior ends of the bristles are touching. The bristles essentially cover the opening thereby preventing air from flowing there through. In the same instance, the cables are still able to pass through the opening by displacing the bristles for their passage there through. Although, the brushes are not shown in FIG. 18, it is contemplated that the cable opening 196 of the enclosure 110 will be a brush opening.

Figure 25:
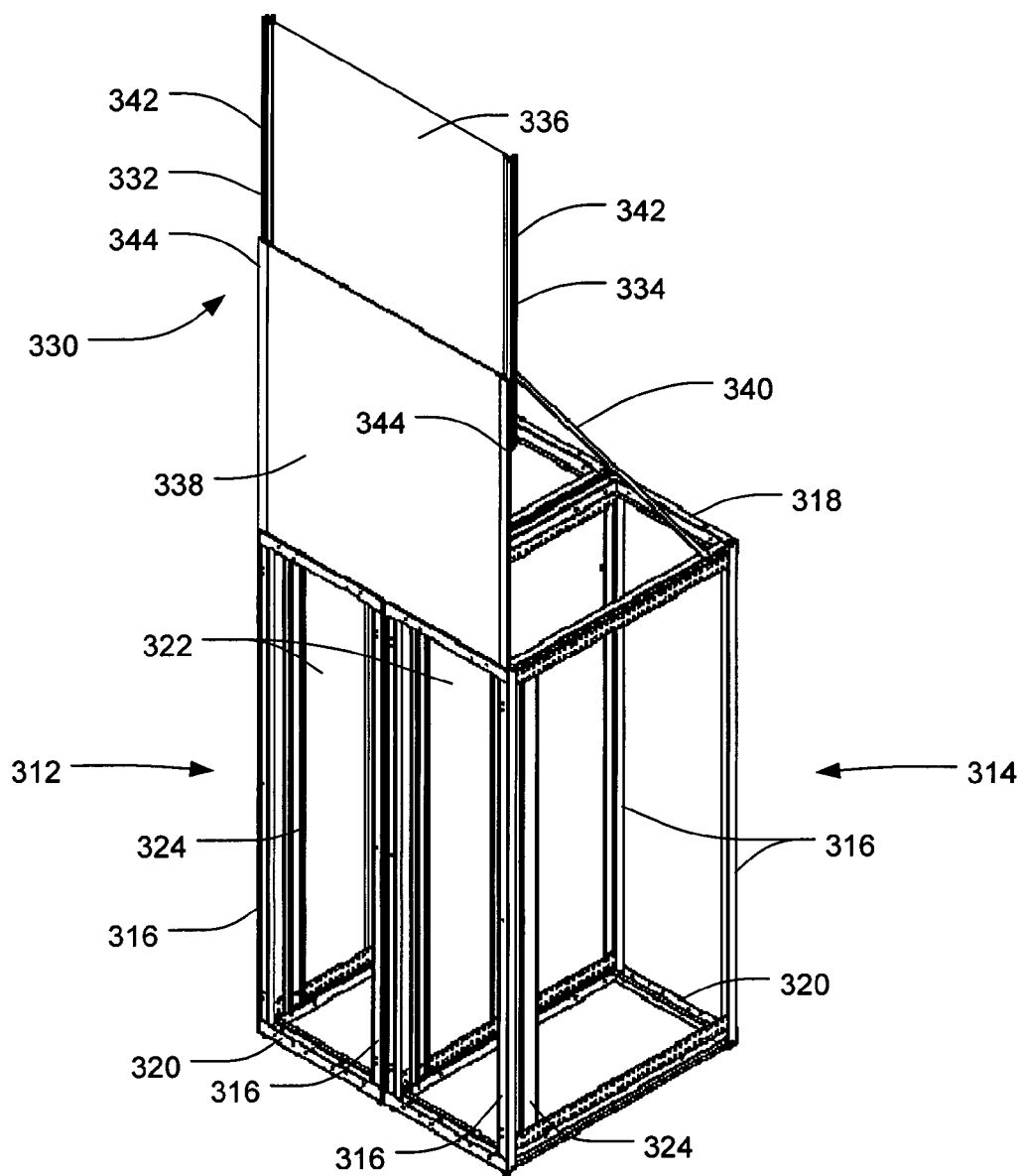

FIG. 25 is an orthogonal view of an above cabinet barrier 330 mounted on a pair of typical cabinets 312, 314 in accordance with the preferred embodiments of the present invention, and FIGS. 26-31 are a right side plan view, a front plan view, a left side plan view, a rear plan view, a top plan view and a bottom plan view, respectively, of the above cabinet barrier 330 and cabinets 312, 314 of FIG. 25. As shown therein, the above cabinet barrier 330 is preferably disposed along the front edge of a pair of cabinets 312, 314. Each cabinet 312, 314 preferably includes a frame, a plurality of panels and one or more equipment support members. The frame includes vertical frame members 316, a top frame 318, and a bottom frame 320. The panels may include side panels 322 such as the ones shown, but may also include a front door or panel (not shown), a rear door or panel (not shown), a top panel (not shown) and a bottom panel (not shown). The equipment support members may include vertical support posts 324, horizontal support members (not shown), other vertical support members (not shown), and the like. The cabinets 312, 314 may be of any conventional construction, and may include features not illustrated herein. Cabinets suitable for use with the preferred embodiments of the present invention are described and illustrated in the commonly-assigned U.S. Pat. Nos. 5,997,117 and 6,185,098, the commonly-assigned U.S. Pat. No. Des. 340,700, and the commonly-assigned U.S. patent application Ser. No. 60/743,148, each of which is incorporated herein by reference.

Each above cabinet barrier 330 preferably includes two vertical support assemblies 332, 334, one or more panels 336, 338 and at least two struts 340.

Figure 30:
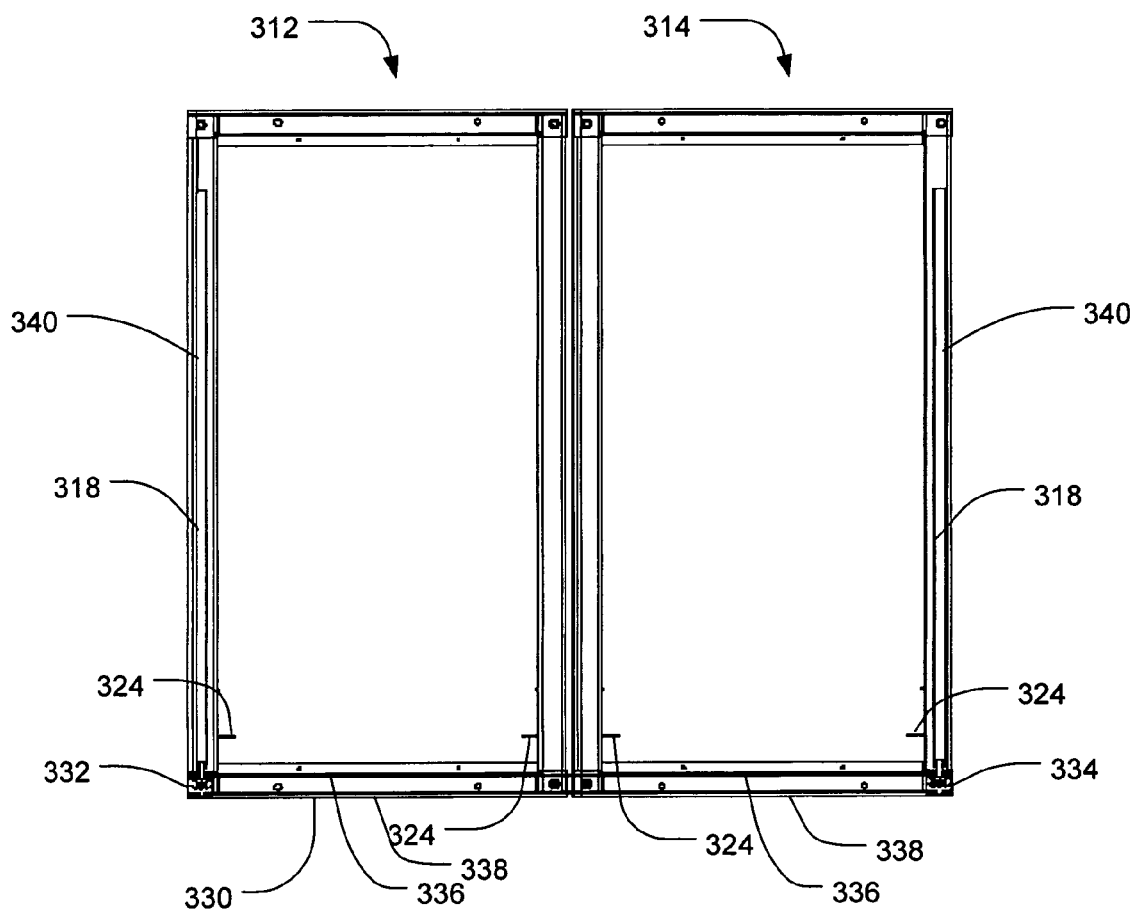
Figure 31:
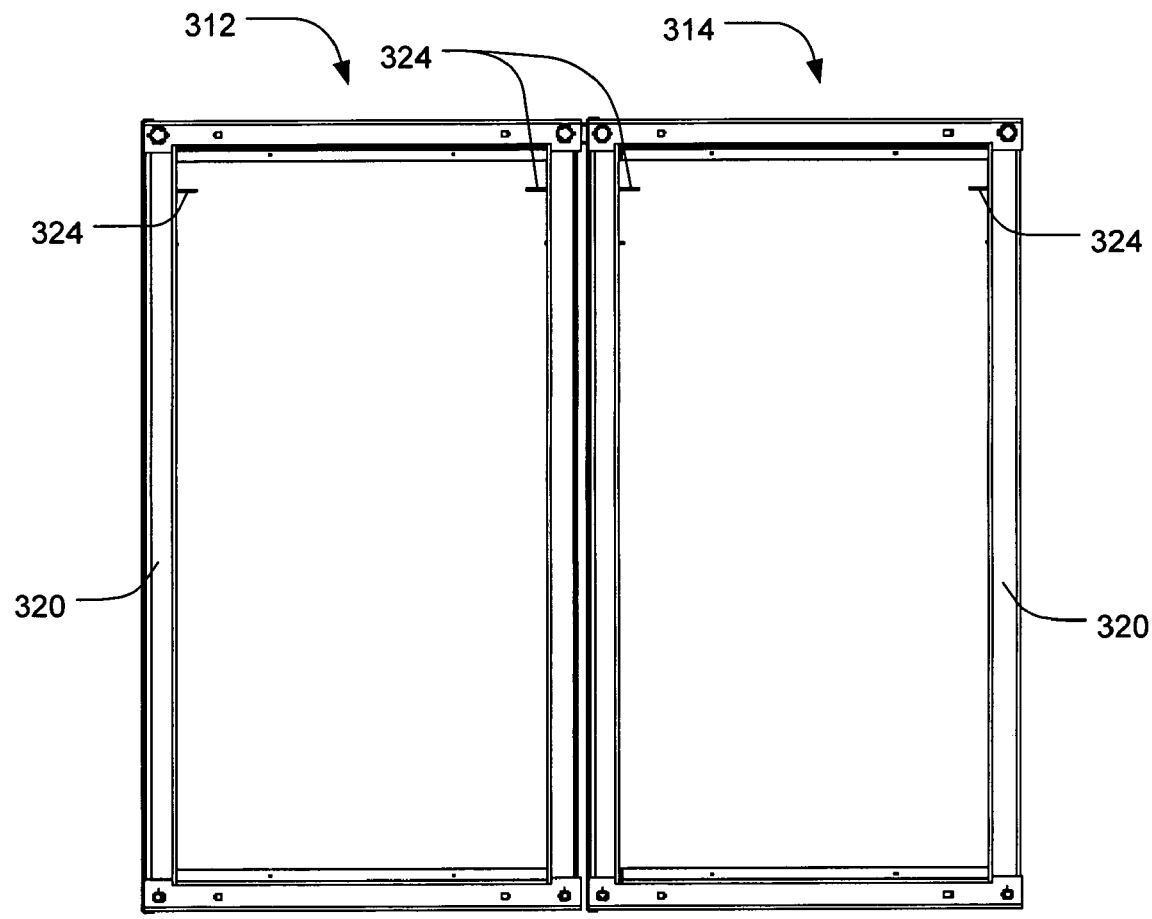
Figure 32:
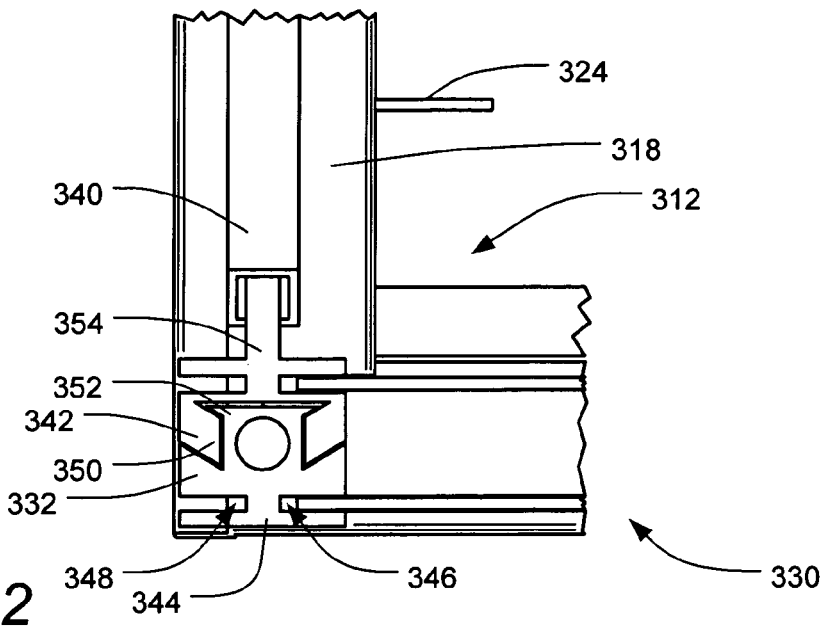
Figure 33:
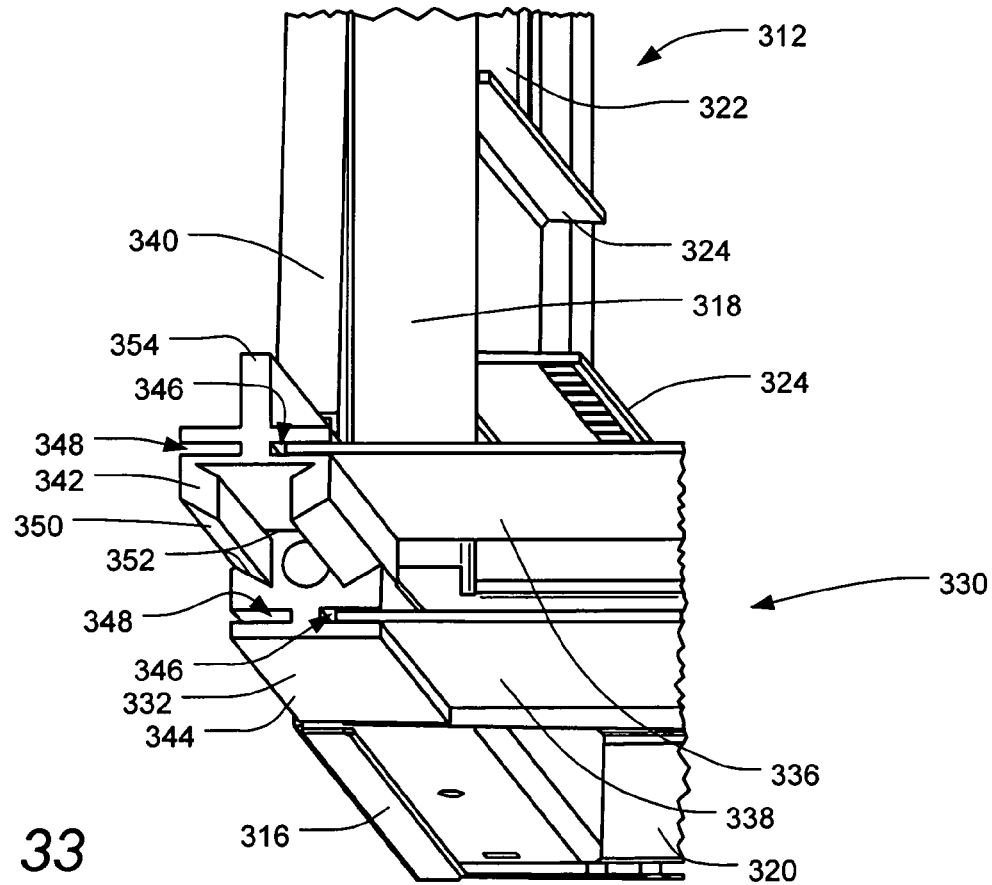

FIG. 32 is a partial top plan view of one corner of the above cabinet barrier 330 and cabinets 312, 314 of FIG. 30, and FIG. 33 is a top orthogonal view of the same corner of the above cabinet barrier 330 and cabinets 312, 314 as that shown in FIG. 32. Only one of the vertical support assemblies 332 is shown in FIG. 31 may be identical to the first. As best shown in FIGS. 32 and 33, each vertical support assembly 332, 334 includes two interlocking vertical channels 342, 344. Although not specifically illustrated, it will be appreciated that the lowermost vertical support assemblies 344 and/or the lowermost panel 338 may be fastened or anchored to the top of one of the cabinets 312, 314 using any suitable means, such as a separate mounting bracket, a customized mounting interface, or the like, together with appropriate fasteners.

Though not identical to each other, the first and second vertical channels 342, 344 of each assembly 332, 334 may each be of extruded construction and preferably include some similar features. For example, each includes a first narrow slot 346 for receiving and retaining one end of one of the panels 336, 338. Further, in order to simplify use and installation, each vertical channel 342, 344 preferably includes a second narrow slot 348, identical to but opposing the first, in order to permit each channel 342, 344 to be used at either end of the barrier 330. One side of the uppermost channel 342 includes a longitudinal mounting feature 350 for sliding and retentive engagement with a corresponding longitudinal mounting feature 352 on the opposing side of the lowermost channel 344 in order to permit the uppermost channel 342 to be vertically adjusted relative to the lowermost channel 344, all for a purpose to be made evident hereinbelow.

The uppermost vertical channel 342 also includes a longitudinal extension 354 running most or all of its length. This extension 354 is sized and proportioned to be received within the interior of one of the struts 340, each of which preferably has a corresponding U-shaped cross-section that may be best seen in FIG. 32. As perhaps best shown in FIGS. 25 and 26, the upper end of each strut 340 may thus be fastened to the longitudinal extension 354 of the uppermost channel 342, while the lower end of each strut 340 may be anchored to the top frame 318 of one of the cabinets 312, 314. The struts 340 thus brace the upper portions of the barrier 330, thereby strengthening the construction of the barrier 330 and limiting the amount of motion permitted thereby relative to the cabinets 312, 314.

Figure 34:
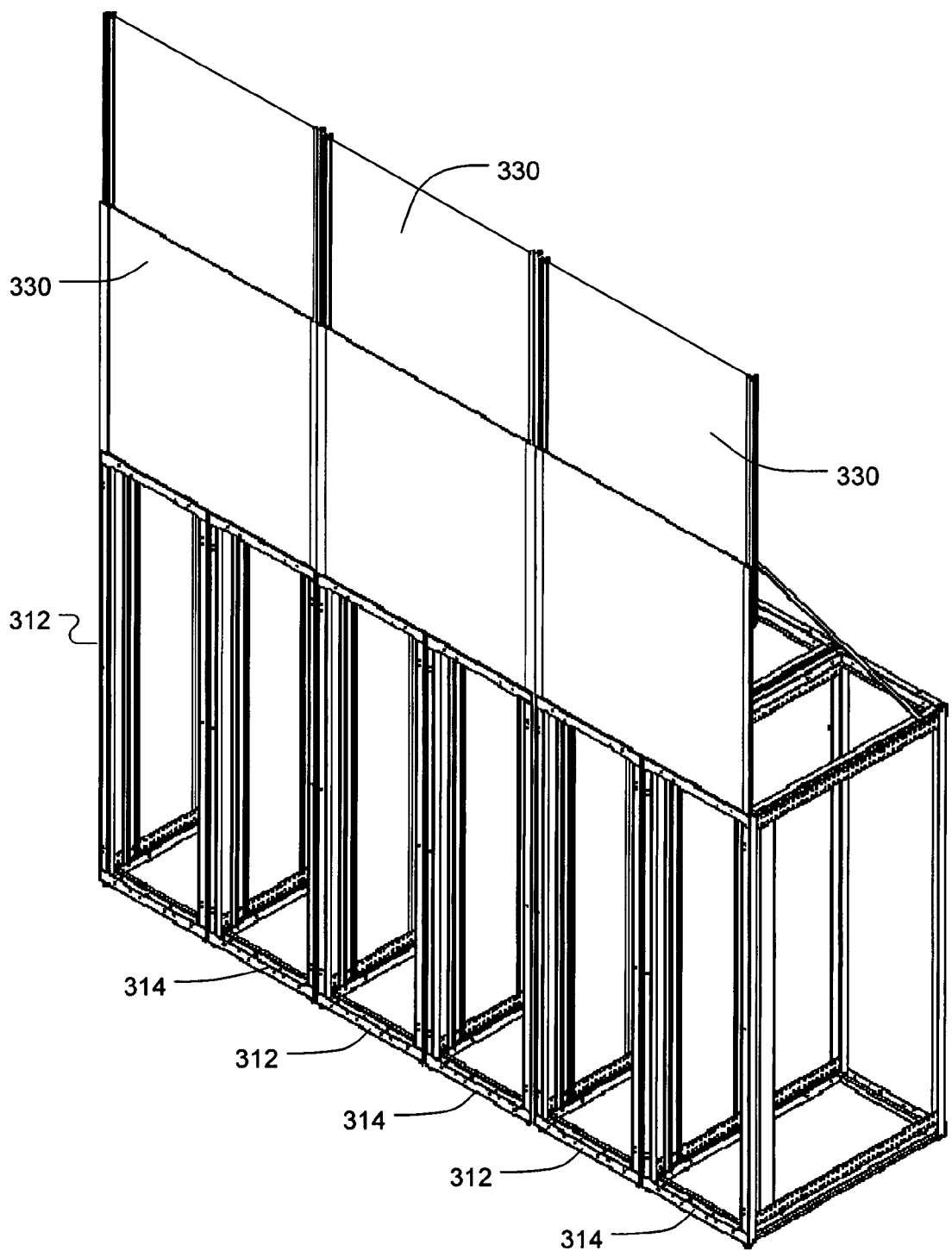

FIG. 34 is an orthogonal view of a single row of cabinets 312, 314 in a data center or computer room with an above cabinet barrier 330 installed on the tops of each pair of cabinets 312, 314. Together, multiple above cabinet barriers 330 installed end-to-end create a single barrier extending the length of the row of cabinets 312, 314.

Figure 35:
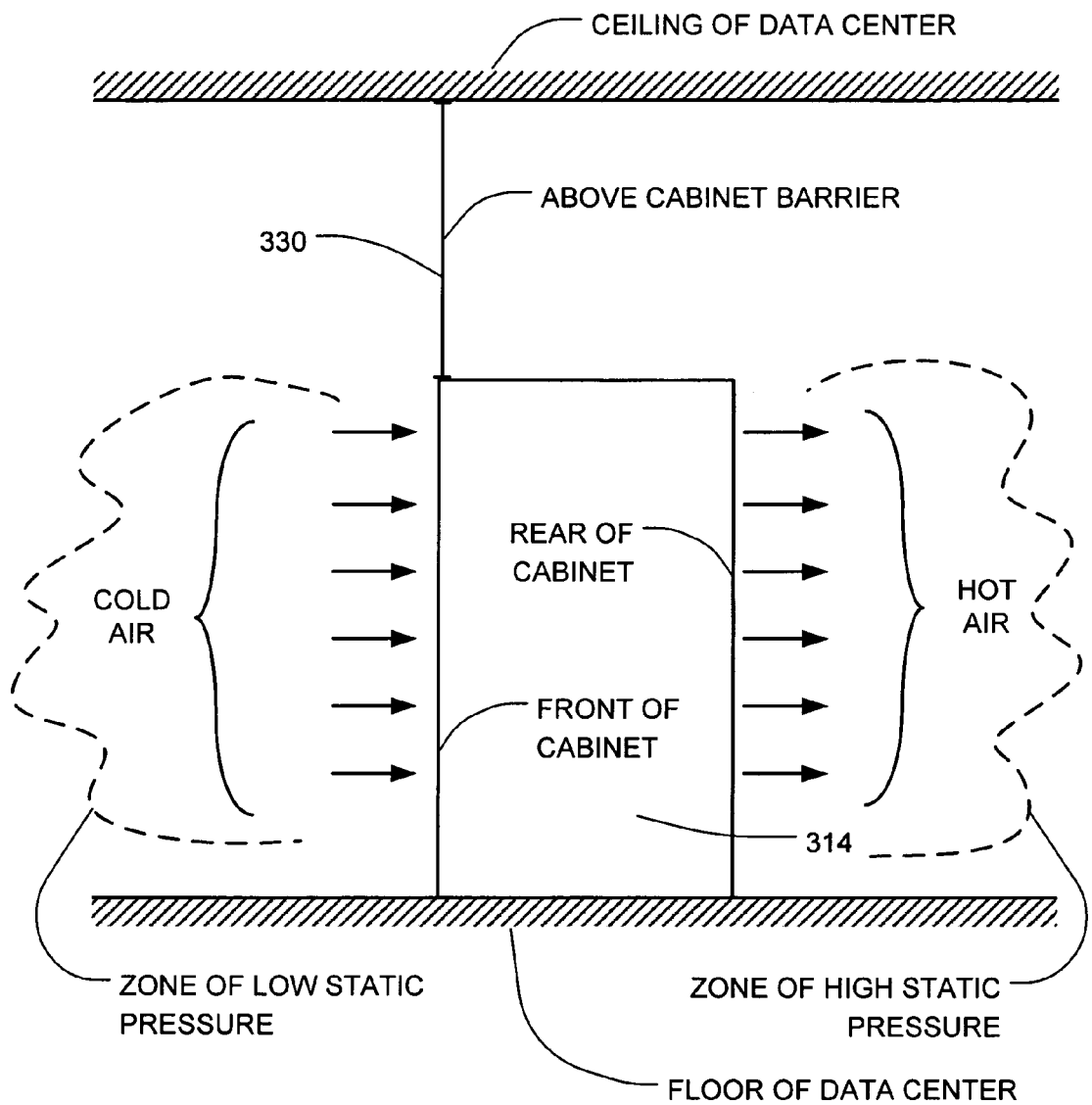

FIG. 35 is a schematic end view, similar to

FIG. 22, of the row of typical cabinets 312, 314 and above cabinet barriers 330 of FIG. 34. As shown therein, the above cabinet barrier 330 typically extends from the top of the cabinets 312, 314 to the ceiling of the data center and forms a continuous, rigid physical barrier that prevents the recirculation of hot air over the tops of the cabinets 312, 314. Depending upon the configuration of the cabinets 312, 314 within the room, and upon the presence or absence of side cabinet barriers as described below, some recirculation of hot air can still occur around the sides of the two cabinets 312, 314 located on the ends of the row. Nevertheless, the total recirculation of hot air is substantially reduced using the above cabinet barrier 330, and the operating life of the top-mounted equipment is increased for the reason described above. This benefit of increased equipment operating life provided by the above cabinet barrier 330 tends to become more pronounced as the average power-density increases in the cabinets 312, 314.

Because different data centers or computer rooms have different distances between floors and ceilings, it is preferable for the above cabinet barrier 330 to be adjustable in such a way as to compensate for the different distances. In the preferred embodiment shown in FIGS. 25-33, this may be accomplished by raising or lowering the uppermost channels 342 of the barrier 330 relative to the lowermost channels 344, thereby raising or lowering the uppermost panel 336 as well. Such a mechanism easily accommodates variations in ceiling height of several feet. It will be apparent to one of ordinary skill, however, that other means may be used to accomplish this purpose as well.

Mounting a single above cabinet barrier 330 across a pair of adjacent cabinets 312, 314 is preferred as the best combination of ease of installation and versatility. However, other configurations may be utilized without departing from the scope of the present invention.

Figure 36:
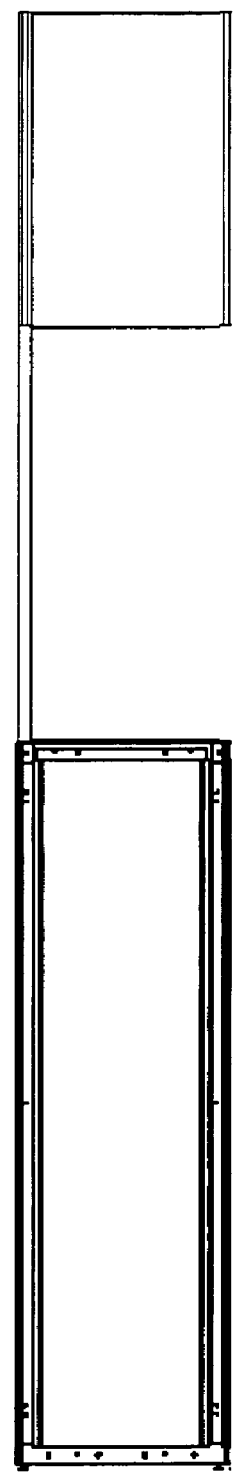
Figure 37:
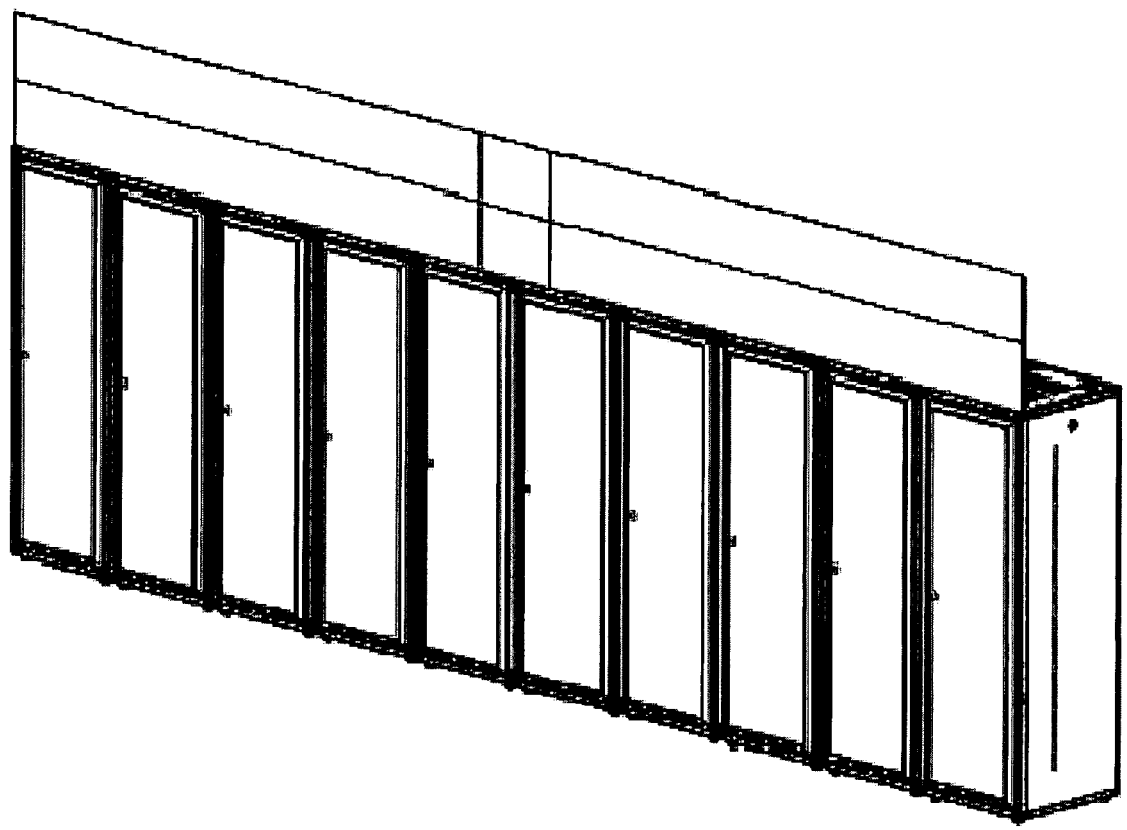

FIG. 36 is a front plan view of an alternative above cabinet barrier mounted on a single typical cabinet in accordance with another preferred embodiment of the present invention, and FIG. 37 is an orthogonal view of an alternative above cabinet barrier mounted on a plurality of typical cabinets in accordance with yet another preferred embodiment of the present invention.

Further, the above cabinet barrier 330 will provide similar benefits though perhaps to a greater or lesser degree in other alternative embodiments, both passive and active. One example of an alternative passive barrier embodiment is a barrier that is discontinuous and contains various slots, slits, and holes. Another example of an alternative passive barrier embodiment is a barrier that is additionally adjustable in height and/or width. Another example of an alternative passive barrier embodiment is a barrier that is flexible. Another example of an alternative active barrier embodiment is a barrier that consists of a high-velocity air curtain. Furthermore, any of these barriers may be arranged to extends only part way from the top of the cabinets to the ceiling of the data center, and various alternative embodiments may include various combinations of these other barrier examples.

As noted previously, hot air may also recirculate around the sides of the two cabinets 312, 314 which are located at the end of the row of cabinets, or around the sides of cabinets that are spaced apart from each other in a row of cabinets (not shown). In an attempt to prevent this recirculation, side cabinet barriers (not shown) may be installed at the sides of, and extending laterally from, any of the cabinets 312, 314. The side cabinet barriers may take the form of panels that are disposed on the side of a cabinet 312, 314 in a location adjacent the front of the cabinet 312, 314, the back of the cabinet 312, 314, or anywhere in between. The panels may be mounted to the cabinets 312, 314, or one or both ends of the panels may be freestanding. If freestanding, the panels (or other implementations of side cabinet barriers) may be positioned as desired, at any angle relative to the side of a cabinet 312, 314. If mounted to the side of a cabinet 312, 314, the panels or other side cabinet barriers may preferably be angularly adjustable relative to the side of a cabinet 312, 314 through the use of an appropriate hinge structure. However, if the panel is arranged at a fixed angular orientation, then it is preferable that the panel or other side cabinet barrier be oriented perpendicularly relative to the side of the cabinet 312, 314.

Preferably, each panel is capable of extending substantially all the way from the bottom of the cabinets to a ceiling above the cabinets. More preferably, each panel is adjustable in width and/or in height, thereby permitting the panel to be adjusted to fit different gaps between cabinets, different ceiling heights, and the like. For example, each side cabinet barrier may be have a form generally similar to that of the of above cabinet barriers described and illustrated herein, wherein each barrier includes a pair of panels and a pair of support assemblies, each of which includes a pair of interlocking channels that may slide relative to each other. The support assemblies may be oriented to permit vertical adjustability or horizontal adjustability, or two sets of support assemblies may be utilized to provide adjustability in both directions. If one end of the side cabinet barrier is supported by a cabinet 312, 314 and the other end is freestanding, it may also be useful to include one or more stabilizing members to prevent the free end of the side cabinet barrier from swinging back and forth.

With regard to both the above cabinet barriers 330 described herein and the side cabinet barriers described herein, it may be useful to arrange the barriers in pairs, with one barrier disposed adjacent the front of each cabinet 312, 314 (as shown in the various drawings) and a second barrier disposed adjacent the rear of each cabinet 312, 314. This may be useful in preventing air from pooling in the space above or beside a cabinet 312, 314, helping to ensure that proper circulation is maintained. The construction of each barrier of the barrier pair may be generally identical if desired.

What is claimed is:

1. A method of providing an electronic equipment enclosure having a plurality of panels, at least one panel of which indented to facilitate maximum ventilation airflow through the electronic equipment enclosure, the method comprising:
  (a) determining design parameters of a panel for the electronic equipment enclosure through which air is intended to flow for ventilating the electronic equipment enclosure, including:
    (i) establishing a ratio of open area to closed area in the panel of between 60% and 70% in order to facilitate maximum ventilation airflow for the electronic equipment enclosure,
    (ii) determining the parameters of openings in the panel such that the established ratio of open area to closed area is preserved, and
    (iii) determining other parameters of the design of the panel while preserving,
      (A) the established ratio of open area to closed area in the panel, and
      (B) the determined parameters of the openings in the panel;
  (b) constructing the panel according to the determined design parameter; and
  (c) providing an electronic equipment enclosure that includes the panel, constructed according to the determined design parameters, whereby maximum ventilation airflow through the electronic equipment enclosure is facilitated;
  (d) wherein said step (a)(iii) comprises varying at least one of the other parameters when at least another of the other parameters is changed in order to maintain the established maximum ratio of open area to closed area.

2. The method of claim 1, wherein the step of establishing a Ratio of open area to closed area includes establishing a ratio of open area to closed area of about 63%.

3. The method of claim 1, wherein the other parameters of said step (a)(iii) comprise a material of which the panel is to be constructed, and a thickness of the panel to be constructed.

4. The method of claim 1, wherein the other parameters of said step (a)(iii) comprise a material of which is to be constructed, and a rigidity of the panel to be constructed.

5. The method of claim 1, wherein the other parameters of said step (a)(iii) comprise of the panel to be constructed, and a rigidity of the panel to be constructed.

6. The method of claim 1, wherein the other parameters of said step (a)(iii) comprise a material of which the panel is to be constructed; a thickness of the panel to be constructed; and a rigidity of the panel to be constructed.

7. A method of providing an electronic equipment enclosure having a front panel and a rear panel, a first panel of the front panel and rear panel facilitating airflow therethrough for ventilation of the electronic equipment enclosure, the method comprising:
   (a) determining the design parameters of the first panel for the electronic equipment enclosure through which air is intended to flow for ventilating the electronic equipment enclosure, including,
      (i) establishing a ratio of open area to closed area in the first panel of between 60% and 70% in order to facilitate maximum ventilation airflow for the electronic equipment enclosure,
      (ii) determining the parameters of openings in the first panel such that the established ratio of open area to closed area is preserved, and
      (iii) determining other parameters of the design of the first panel while preserving,
         (A) the established ratio of open area to closed area in the first panel, and
         (B) the determined parameters of the openings in the first panel;
   (c) determining the design parameters of the second panel of the front panel and rear panel, including establishing a ratio of open area to closed area in the second panel of about 0%;
   (d) constructing the first panel and the second panel according to the determined design parameters; and
   (e) providing an electronic equipment enclosure that in includes,
      (i) the first panel, constructed according to its determined design parameters,
      (ii) the second panel, constructed according to its determined design parameters, and
      (iii) an exhaust duct extending upward from a top of the enclosure whereby maximum ventilation airflow through the electronic equipment enclosure is facilitated;
   (f) wherein said step (a)(iii) comprises varying at least one of the other parameters when at least another of the other parameters is changed in order to maintain the established maximum ratio of open area to closed area in the first panel.

8. The method of claim 7, wherein the step of establishing a ratio of open area to closed area includes establishing a ratio of open area to closed area of about 63%.

9. The method of claim 7, wherein the step of providing an electronic equipment enclosure that includes an exhaust duct includes providing an exhaust duct that extends from the top of the enclosure to a ceiling structure of a room in which the electronic equipment enclosure is disposed.

10. The method of claim 9, wherein providing an exhaust duct includes connecting the exhaust duct to the ceiling structure such that the exhaust duct is in direct fluid communication with a ceiling-mounted return air duct of the room in which the electronic equipment enclosure is disposed.

11. The method of claim 7, wherein the step of providing an electronic equipment enclosure that includes an exhaust duct includes providing an exhaust duct having a rectangular cross-section.

12. The method of claim 7, wherein the other parameters of said step (a)(iii) comprise a material of which the first panel is to be constructed, and a thickness of the first panel to be constructed.

13. The method of claim 7, wherein the other parameters of said step (a)(iii) comprise a material of which the first panel is to be constructed, and a rigidity of the first panel to be constructed.

14. The method of claim 7, wherein the other parameters of said step (a)(iii) comprise a thickness of the first panel to be constructed, and a rigidity of the first panel to be constructed.

15. The method of claim 7, wherein the other parameters of said step (a)(iii) comprise a material of which the first panel is to be constructed; a thickness of the first panel to be constructed; and a rigidity of the first panel to be constructed.

16. A method of providing an electronic equipment enclosure having a plurality of panels, the method comprising:
   (a) identifying a first panel and a second panel, of the plurality of panels, through which air is intended to flow for ventilating the electronic equipment enclosure;
   (b) determining design parameters of the first panel for the electronic equipment enclosure through which air is intended to flow for ventilating the electronic equipment enclosure, including:
      (i) establishing a maximum ratio of open area to closed area in the first panel of between 60% and 70%,
      (ii) the parameters of openings in the first panel such that the established ratio of open area to closed area is preserved, and
      (iii) determining other parameters of the design of the first panel while preserving,
         (A) the established ratio of op en area to closed area in the first panel, and
         (B) the determined parameters of the openings in the first panel;
   (c) determining design parameters of the second panel for the electronic equipment enclosure through which air is intended to flow for ventilating the electronic equipment enclosure, including:
      (i) establishing a maximum ratio of open area to closed area in the second panel of between 60% and 70%,
      (ii) determining the parameters of openings in the second panel such that the established ratio of open area to closed area is preserved, and
      (iii) determining, other parameters of the design of the second panel while preserving,
         (A) the established ratio of open area to closed area in the second panel, and
         (B) the determined parameters of the openings in the second panel; and
   (d) providing an electronic equipment enclosure, including:
      (i) providing the first and second panels constructed according to their determined design parameters, and
      (ii) providing an above cabinet barrier extending upward from a top of the enclosure (e) wherein said step (b)(iii) comprises varying at least one of the other parameters when at least another of the other parameters is changed in order to maintain the established maximum ratio of open area to closed area in the first panel; and (f) wherein said step (c)(iii) comprises varying at least one of the other parameters when at least another of the other parameters is changed in order to maintain the established maximum ratio of open area to closed area in the second panel.

17. The method of claim 16, wherein the step of determining the design parameters of the first panel includes establishing a maximum ratio of open area to closed area of about 63%.

18. The method of claim 17, wherein determining the design parameters of the second panel includes establishing a maximum ratio of open area to closed area of about 63%.

19. The method of claim 17, wherein the electronic equipment enclosure has a front and a rear, and wherein the first and second panels are the front and rear panels of the electronic equipment enclosure.

20. The method of claim 19, wherein the above cabinet barrier extends substantially entirely from one side of the electronic equipment enclosure to the opposite side.

21. The method of claim 16, wherein the other parameters of said step (b)(iii) comprise a material of which the first panel is to be constructed and a thickness of the first panel.

22. The method of claim 16, wherein the other parameters of said step (b)(iii) comprise a material of which the first panel is to be constructed and a rigidity of the first panel.

23. The method of claim 16, wherein the other parameters of said step (b)(iii) comprise a thickness of the first panel and a rigidity of the first panel.

24. The method of claim 16, wherein the other parameters of said step (b)(iii) comprise a material of which the first panel is to be constructed; a thickness of the first panel; and a rigidity of the first panel.

25. The method of claim 24, wherein the other parameters of said step (c)(iii) comprise a material of which the second panel is constructed; a thickness of the second panel; and a rigidity of the second panel.

* * * * *

UNITED STATES PATENT AND TRADEMARK OFFICE
CERTIFICATE OF CORRECTION

| | | |
|---|---|---|
| PATENT NO. | : 7,438,638 B2 | |
| APPLICATION NO. | : 11/548158 | |
| DATED | : October 21, 2008 | |
| INVENTOR(S) | : Richard Evans Lewis, II, Ian Seaton and James I. Lawrence | |

It is certified that error appears in the above-identified patent and that said Letters Patent is hereby corrected as shown below:

Column 5, line 44, the line should read "flow reduction for the 100% open configuration of FIG. 3;"; line 57, the word "and" should be deleted.

Figure 13:
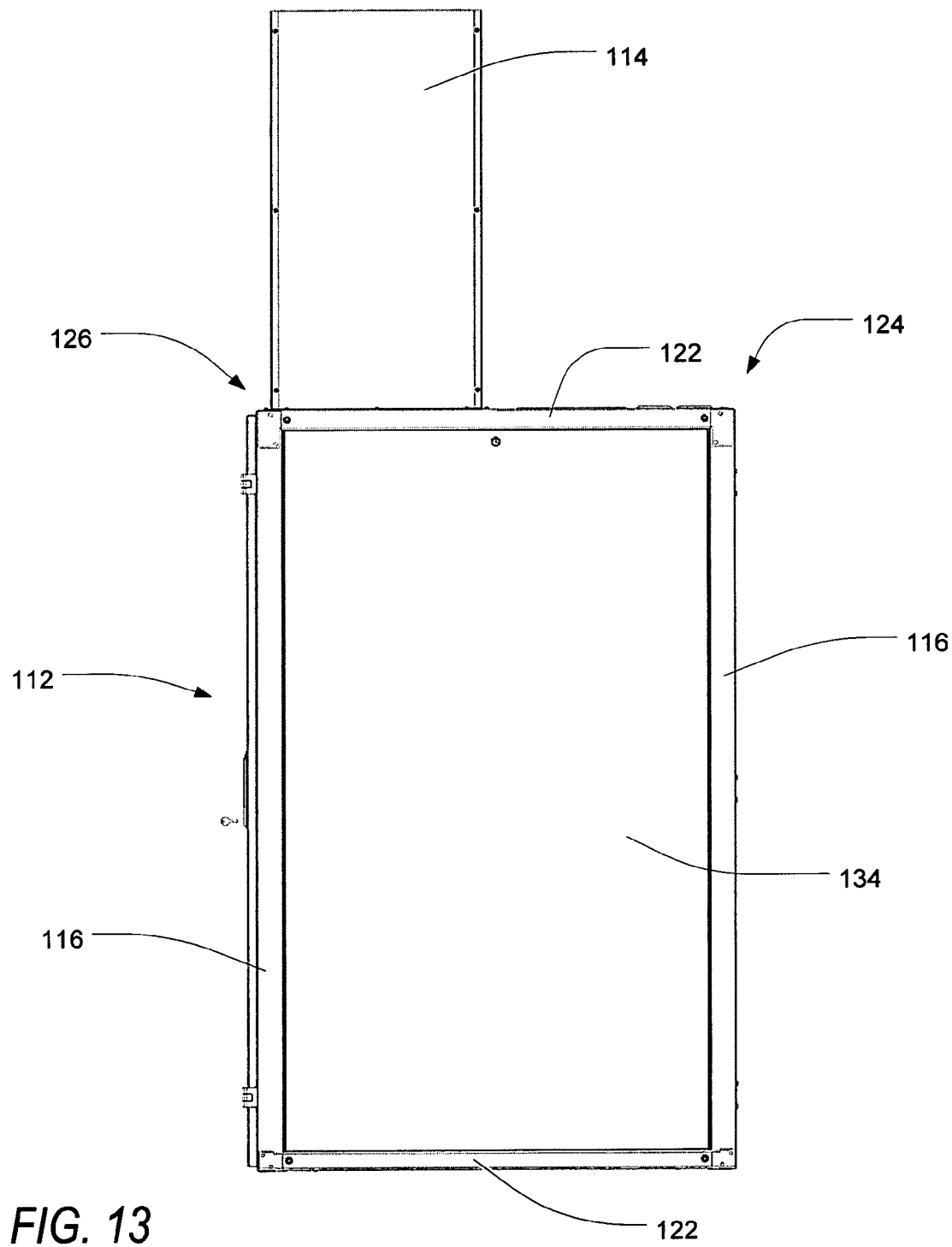
Figure 14:
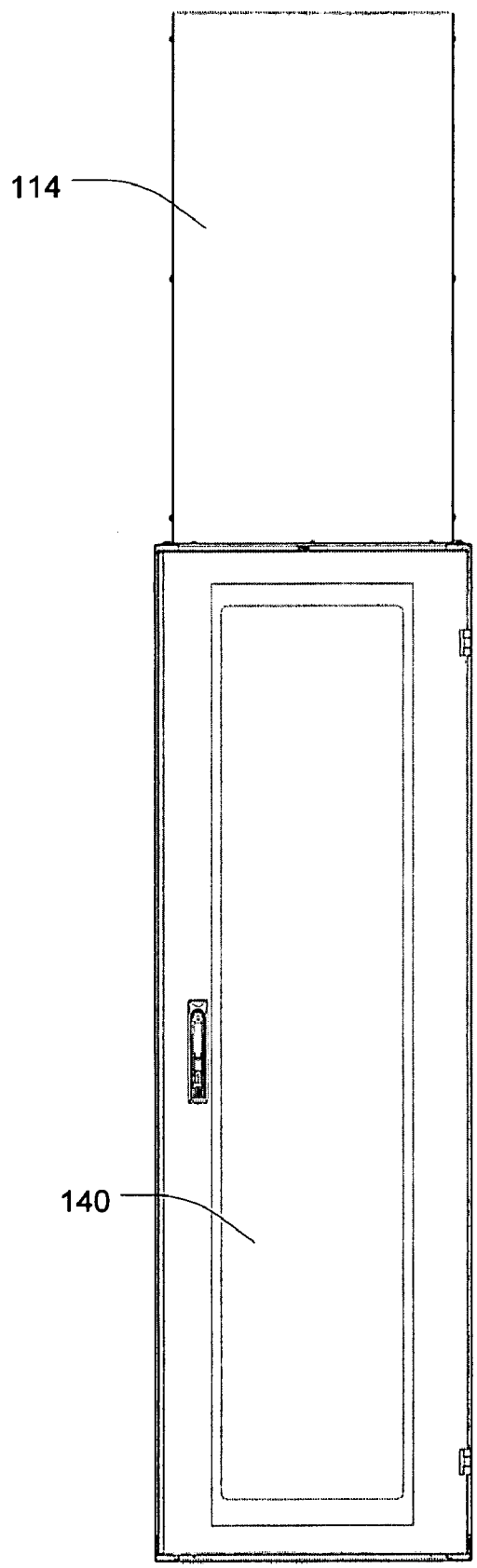
Figure 26:
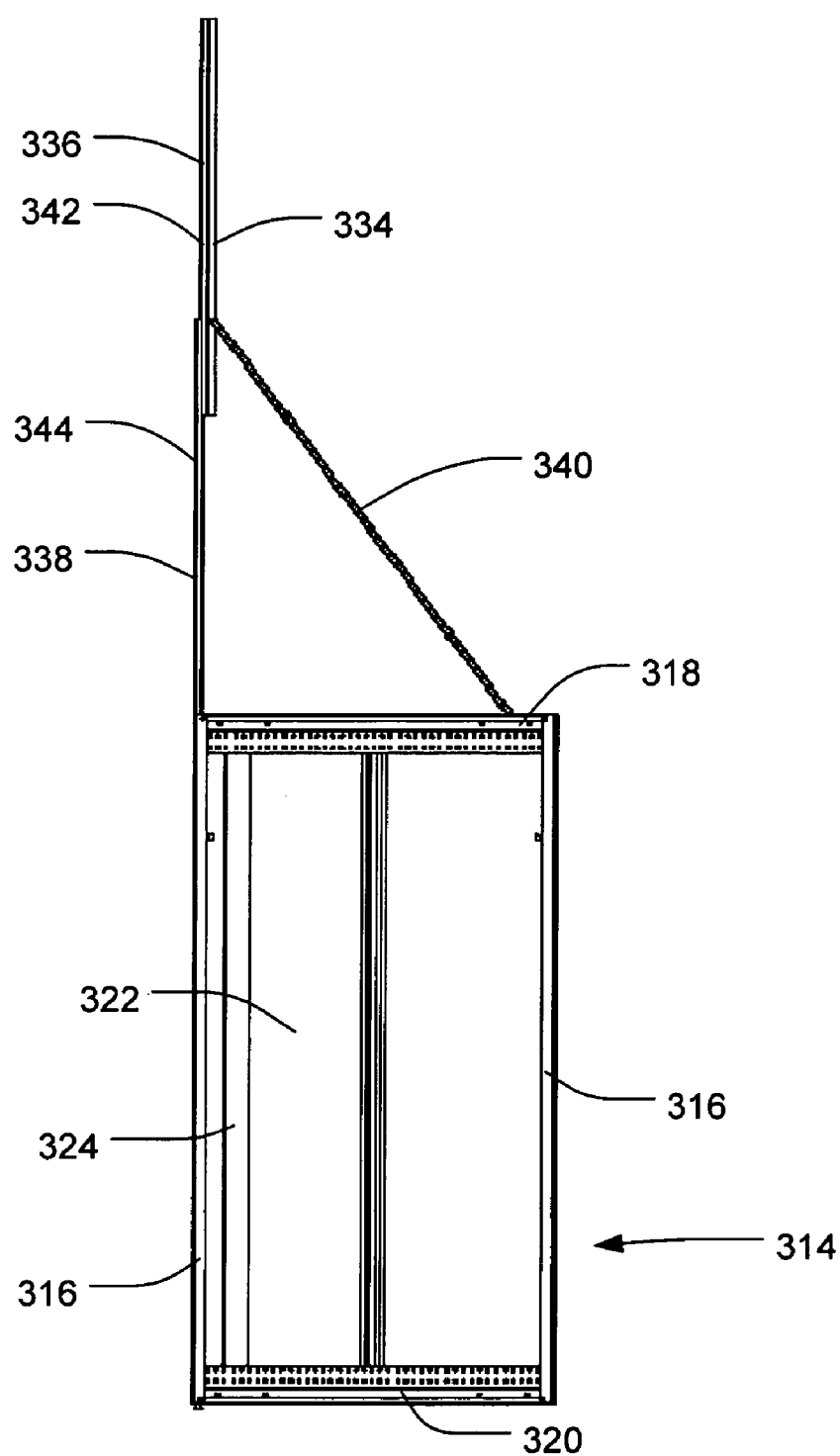
Figure 27:
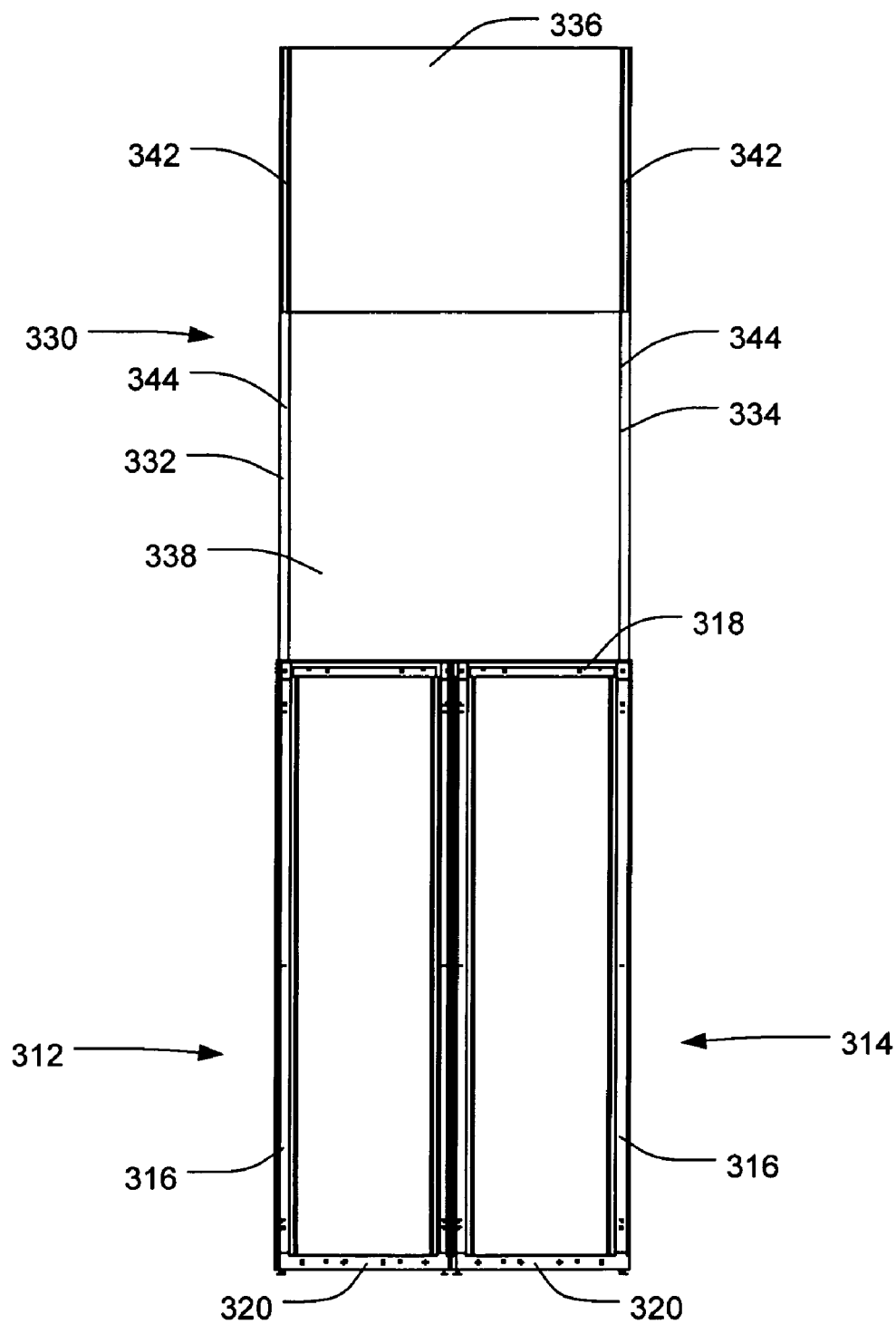
Figure 28:
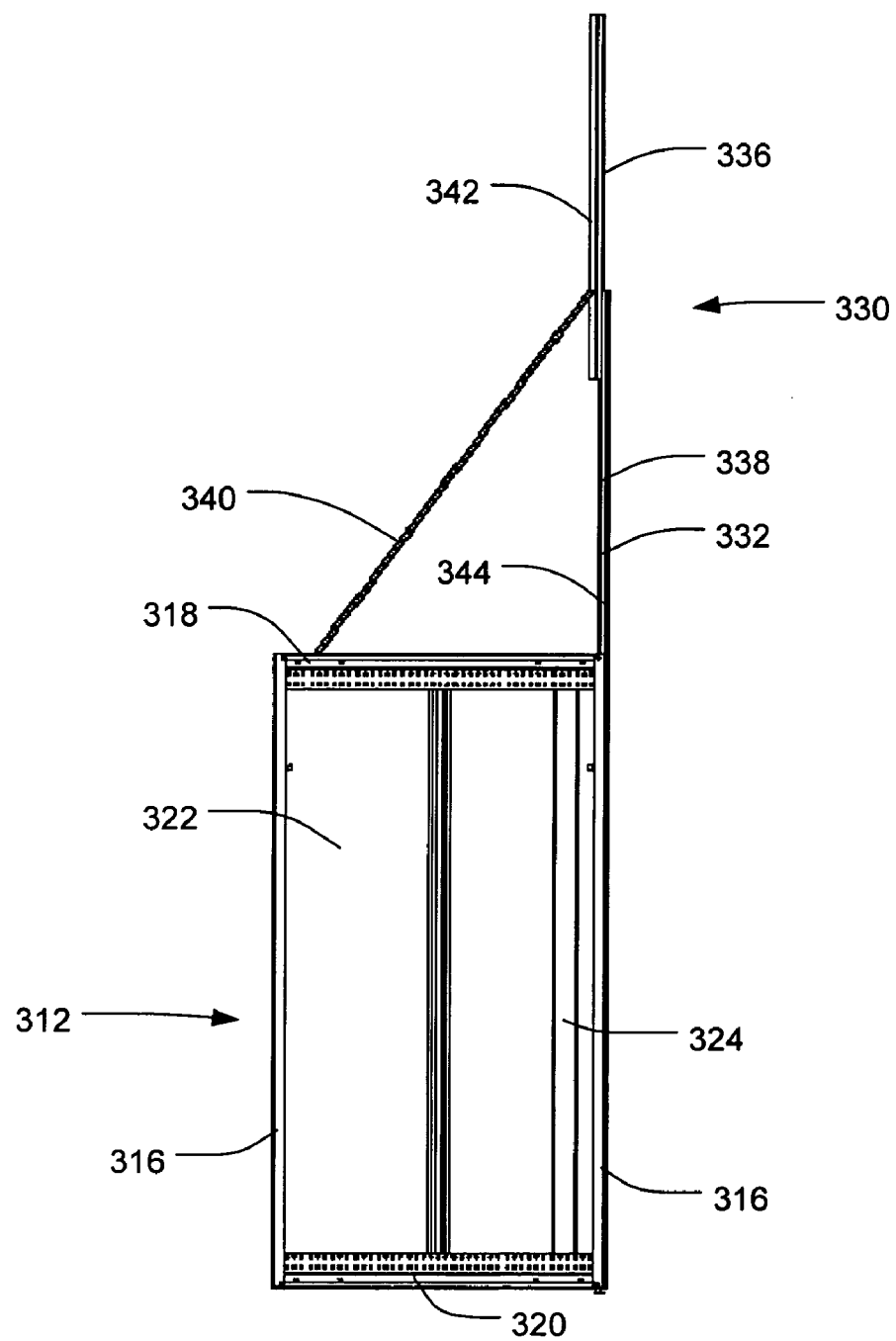
Figure 29:
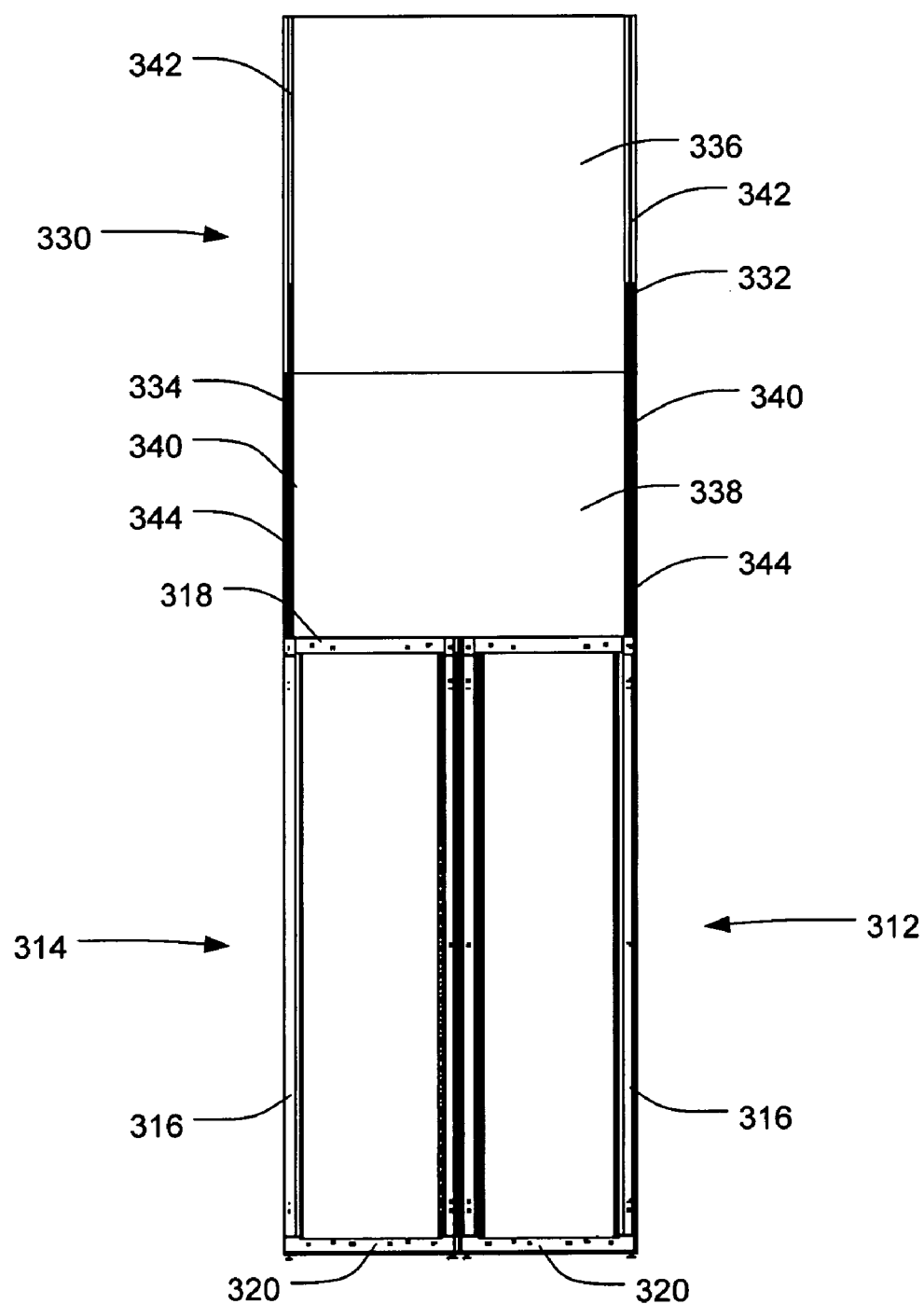

Column 5, line 60, the following text should be added following the wording "a controlled flowrate test":
-- FIG. 12 is a rear isometric view of a ducted exhaust equipment enclosure in accordance with a preferred embodiment of the present invention;
FIG. 13 is a left plan view of the ducted exhaust equipment enclosure of FIG. 12;
FIG. 14 is a rear plan view of the ducted exhaust equipment enclosure of FIG. 12;
FIG. 15 is a front plan view of the ducted exhaust equipment enclosure of FIG. 12;
FIG. 16 is a top plan view of the ducted exhaust equipment enclosure of FIG. 12;
FIG. 17 is a bottom plan view of the ducted exhaust equipment enclosure of FIG. 12;
FIG. 18 is a left side cross-sectional view of the ducted exhaust equipment enclosure of FIG. 12, taken along the line 18-18;
FIG. 19 is an isometric view of the exhaust air duct of FIG. 12;
FIG. 20 is an isometric view of an exemplary telescoping exhaust air duct for use with the ducted exhaust equipment enclosure of FIG. 12;
FIG. 21 is a front orthogonal view of the scope of FIG. 18;
FIG. 22 is a rear isometric view of the ducted exhaust equipment enclosure of FIG. 12, shown installed on a raised floor;
FIG. 23 is a side cross-sectional view of the ducted exhaust equipment enclosure of FIG. 22, taken along the line 23-23;
FIG. 24 is a schematic illustration of a series of ducted exhaust equipment enclosures;
FIG. 25 is an orthogonal view of an above cabinet barrier mounted on a pair of typical cabinets in accordance with a preferred embodiment of the present invention;
FIG. 26 is a right side plan view of the above cabinet barrier and cabinets of FIG. 25;
FIG. 27 is a front plan view of the above cabinet barrier and cabinets of FIG. 25;
FIG. 28 is a left side plan view of the above cabinet barrier and cabinets of FIG. 25;
FIG. 29 is a rear plan view of the above cabinet barrier and cabinets of FIG. 25;
FIG. 30 is a top plan view of the above cabinet barrier and cabinets of FIG. 25;
FIG. 31 is a bottom plan view of the above cabinet barrier and cabinets of FIG. 25;
FIG. 32 is a partial top plan view of one corner of the above cabinet barrier and cabinets of FIG. 30;
FIG. 33 is a top orthogonal view of the same corner of the above cabinet barrier and cabinets as that shown in FIG. 32;
FIG. 34 is an orthogonal view of a row of typical cabinets having one or more above cabinet barriers mounted thereon;

UNITED STATES PATENT AND TRADEMARK OFFICE
CERTIFICATE OF CORRECTION

| | | |
|---|---|---|
| PATENT NO. | : 7,438,638 B2 | Page 2 of 4 |
| APPLICATION NO. | : 11/548158 | |
| DATED | : October 21, 2008 | |
| INVENTOR(S) | : Richard Evans Lewis, II, Ian Seaton and James I. Lawrence | |

It is certified that error appears in the above-identified patent and that said Letters Patent is hereby corrected as shown below:

(continued from previous page)
FIG. 35 is a schematic end view of the row of typical cabinets and above cabinet barriers of FIG. 34;
FIG. 36 is a front plan view of an alternative above cabinet barrier mounted on a single typical cabinet in accordance with another preferred embodiment of the present invention; and
FIG. 37 is an orthogonal view of an alternative above cabinet barrier mounted on a plurality of typical cabinets in accordance with another preferred embodiment of the present invention. --.

Column 8, line 14, "63%as" should be changed to -- 63% as --; line 16, "pairof" should be changed to -- pair of --.

Column 9, line 26, "auses" should be changed to -- causes --.

Column 13, line 39, "10A" should not be in bold print.

Column 14, line 8, "6300" should be changed to -- 63% --; line 15, "6300" should be changed to -- 63% --; line 40, "open area "open configuration")" should be changed to -- open area ("open configuration") --; line 58, "12, 10, 8, and 6" should not be in bold print.

Column 15, line 54, the word -- more -- should be added before the word "than".

Column 22, line 32, "10000" should be changed to -- 100% --and should not be in bold print; line 41, "1000o" should be changed to -- 100% -- and should not be in bold print.

Column 24, line 15, "FIG. 31" should be changed to -- FIGS. 31 and 32, but it will be appreciated that the other vertical support assembly 334 -- and the reference numeral "334" should be shown in bold print.

Column 25, line 29, the wording -- For example, -- should be added before "FIG. 36".

UNITED STATES PATENT AND TRADEMARK OFFICE
CERTIFICATE OF CORRECTION

| | | |
|---|---|---|
| PATENT NO. | : 7,438,638 B2 | |
| APPLICATION NO. | : 11/548158 | |
| DATED | : October 21, 2008 | |
| INVENTOR(S) | : Richard Evans Lewis, II, Ian Seaton and James I. Lawrence | |

It is certified that error appears in the above-identified patent and that said Letters Patent is hereby corrected as shown below:

(continued from previous page)
   Column 26, line 35, the following text should be added following the wording "identical if desired.":
--      Such results are counter to what was previously believed. In addition, these results are beneficial for enclosure manufacturers and users. Based on these results, an enclosure manufacturer does not have to sacrifice thermal energy removal for security and stability in enclosure design. Both goals may be achieved without sacrificing one or the other.
         Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.
         Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation. --.

UNITED STATES PATENT AND TRADEMARK OFFICE
CERTIFICATE OF CORRECTION

PATENT NO.        : 7,438,638 B2
APPLICATION NO.   : 11/548158
DATED             : October 21, 2008
INVENTOR(S)       : Richard Evans Lewis, II, Ian Seaton and James I. Lawrence It is certified that error appears in the above-identified patent and that said Letters Patent is hereby corrected as shown below:

(continued from previous page)
   Column 27, line 10, the wording -- the panel -- should be added after the wording "comprise a material of which"; line 13, the wording -- a thickness -- should be added after the wording "said step (a)(iii) comprise"; line 47, the word "in" should be deleted.

Column 28, line 38, the word -- determining -- should be added before the wording "the parameters of openings".

Signed and Sealed this

Twenty-fourth Day of February, 2009

JOHN DOLL
*Acting Director of the United States Patent and Trademark Office*